US012655016B2

(12) United States Patent
Gogoi et al.

(10) Patent No.:  US 12,655,016 B2
(45) Date of Patent:  Jun. 16, 2026

(54) MICRO-ELECTRO-MECHANICAL SYSTEMS (MEMS) HAVING VERTICAL STOPS AND ANCHOR STRUCTURES

(71) Applicant: Lawrence Semiconductor Research Laboratory, Inc., Tempe, AZ (US)

(72) Inventors: Bishnu Prasanna Gogoi, Scottsdale, AZ (US); Chantal Arena, Mesa, AZ (US)

(73) Assignee: Lawrence Semiconductor Research Laboratory, Inc., Tempe, AZ (US)

( * ) Notice: Subject to any disclaimer, the term of this patent is extended or adjusted under 35 U.S.C. 154(b) by 375 days.

(21) Appl. No.: 18/533,820

(22) Filed: Dec. 8, 2023

(65) Prior Publication Data

US 2025/0187901 A1     Jun. 12, 2025

(51) Int. Cl.
　　B81B 3/00　　　　(2006.01)
　　B81C 1/00　　　　(2006.01)
(52) U.S. Cl.
　　CPC ........ B81B 3/0051 (2013.01); B81C 1/00182 (2013.01); B81B 2201/0235 (2013.01); B81B 2203/0307 (2013.01); B81C 2201/0121 (2013.01); B81C 2201/0132 (2013.01)
(58) Field of Classification Search
　　CPC ......... B81B 3/0051; B81B 3/00; B81B 3/001; B81B 3/0021; B81B 2201/0235; B81B 2203/0307; B81C 2201/0121; B81C 2201/0132; B81C 2201/0177; B81C 1/00182; B81C 1/00; B81C 1/00246
　　See application file for complete search history.

(56) References Cited

U.S. PATENT DOCUMENTS

| | | | |
|---|---|---|---|
| 5,294,556 A | 3/1994 | Kawamura |
| 5,576,250 A | 11/1996 | Diem et al. |
| 5,616,514 A | 4/1997 | Muchow et al. |
| 5,616,523 A | 4/1997 | Benz et al. |
| 5,750,420 A | 5/1998 | Bono et al. |
| 5,879,963 A | 3/1999 | Howe et al. |
| 5,959,208 A | 9/1999 | Muenzel et al. |
| 5,963,818 A | 10/1999 | Kao et al. |
| 6,030,850 A | 2/2000 | Kurle et al. |
| 6,055,858 A | 5/2000 | Muenzel et al. |
| 6,194,722 B1 | 2/2001 | Fiorini et al. |

(Continued)

FOREIGN PATENT DOCUMENTS

| | | | |
|---|---|---|---|
| WO | 2006130665 A2 | 12/2006 |
| WO | 2010148405 A2 | 12/2010 |
| WO | 2017061638 A1 | 4/2017 |

*Primary Examiner* — Nikolay K Yushin
(74) *Attorney, Agent, or Firm* — Quarles & Brady LLP; Yakov S. Sidorin

(57)　　　　　ABSTRACT

A semiconductor device is disclosed having one or more stops that is configured to limit movement of a moving mass. The one or more stops are formed in or on the semiconductor substrate. The one or more stops are attached to the moving mass. An intermediate layer is formed overlying the semiconductor substrate. A device layer is formed overlying the intermediate layer. The device layer, the intermediate layer, and the semiconductor substrate are single crystal. The moving mass is formed in the device layer with the one or more stops. The one or more stops comprises the material of the device layer. The moving mass couples to at least one anchor. Portions of the intermediate layer are removed to free the moving mass in relation to the semiconductor substrate.

18 Claims, 16 Drawing Sheets

(56) References Cited

U.S. PATENT DOCUMENTS

| | | | |
|---|---|---|---|
| 6,413,793 | B1 | 7/2002 | Lin et al. |
| 6,448,622 | B1 | 9/2002 | Franke et al. |
| 6,524,878 | B2 | 2/2003 | Abe et al. |
| 6,569,701 | B2 | 5/2003 | Knieser et al. |
| 6,756,310 | B2 | 6/2004 | Kretschmann et al. |
| 6,768,628 | B2 | 7/2004 | Harris et al. |
| 6,913,941 | B2 | 7/2005 | O'Brien et al. |
| 6,916,728 | B2 | 7/2005 | Gogoi et al. |
| 7,018,550 | B2 | 3/2006 | Harris et al. |
| 7,122,395 | B2 | 10/2006 | Gogoi |
| 7,176,111 | B2 | 2/2007 | Baert et al. |
| 7,387,737 | B2 | 6/2008 | Harris et al. |
| 9,090,452 | B2 | 7/2015 | Cheng et al. |
| 10,571,681 | B2 | 2/2020 | Meier et al. |
| 11,923,313 | B2 | 3/2024 | Costa et al. |
| 2016/0221824 | A1 | 8/2016 | Alper et al. |
| 2022/0162058 | A1 | 5/2022 | Hsieh et al. |
| 2023/0260921 | A1 | 8/2023 | Costa et al. |
| 2024/0038582 | A1 | 2/2024 | Chetry et al. |

MICRO-ELECTRO-MECHANICAL SYSTEMS (MEMS) HAVING VERTICAL STOPS AND ANCHOR STRUCTURES

TECHNICAL FIELD

Embodiments of the present disclosure relate to semiconductor device manufacture and, in particular, to methods of manufacture of Micro-Electro-Mechanical Systems (MEMS) devices.

BACKGROUND

Micro-Electro-Mechanical Systems (MEMS) devices are used in a wide variety of applications and electronic devices. Sensors that measure physical parameters can be implemented in a MEMS device. Typically, the physical parameter measured by the MEMS device is converted to an equivalent electrical signal to interface with electronic circuitry to utilize the quantitative measurement. MEMS devices are three dimensional physical structures formed in a semiconductor substrate that are designed to convert measured physical parameters to equivalent electrical signals.

Typically, a MEMS device has a moving component. The moving component moves in relation to a static component of the system such as the semiconductor substrate in which the MEMS device is formed. A MEMS device utilizes one or more anchors to support a moving element. The one or more anchors attach to the semiconductor substrate. The moving element is typically suspended from the semiconductor substrate and is configured to move in relation to the semiconductor substrate. Movement of the moving element corresponds to the parameter being measured such as acceleration, rotation, angular velocity, humidity, or pressure.

The one or more anchors must be strong enough to support the moving element. As mentioned, the base of the one or more anchors is attached to the semiconductor substrate. Moreover, the anchor has to withstand the stress exerted by the moving element under the forces applied by the parameter being measured. As is often the case, the manufacture of the anchor can be very complex thereby increasing the cost of the MEMS device.

A further aspect of a MEMS device is that movement is limited by design. A spacing between a moving mass and the semiconductor substrate is often determined by manufacturing constraints and a range required for a parameter being measured by the MEMS device. The moving mass can contact the semiconductor substrate if the parameter being measured exceeds the useful range of the MEMS device. Contact between the moving mass and the semiconductor substrate can damage the MEMS device. The moving mass can also stick to the semiconductor substrate and not return to a quiescent position. This is often described as stiction between the moving mass and the semiconductor substrate. A stop is often added to the moving mass to reduce the effects of stiction. Adding a stop can cause further complexity to the design of the MEMS device.

Thus, it would be of great benefit if a stop can be added to a moving mass of a MEMS device that will add reliability, improve performance and is manufacturable with an anchor that supports the moving mass.

BRIEF DESCRIPTION OF THE DRAWINGS

Various features of embodiments of the present disclosure can be understood by reference to the following description, taken in conjunction with the accompanying drawings, in which.

DETAILED DESCRIPTION

The following description of example embodiments of the present disclosure is merely illustrative in nature and is in no way intended to limit the invention as defined by the claims, its application, or uses.

For simplicity and clarity of the illustration, elements in the figures are not necessarily to scale, are only schematic, are non-limiting, and the same reference numbers in different figures denote the same elements, unless stated otherwise. Additionally, descriptions and details of well-known steps and elements are omitted for simplicity of the description. Notice that once an item is defined in one figure, it may not be discussed or further defined in the following figures.

The terms "first," "second," "third" and the like are used herein for distinguishing between similar elements and not necessarily for describing a sequence, either temporally, spatially, in ranking or in any other manner. It is to be understood that the terms so used are interchangeable under appropriate circumstances and that the embodiments described herein are capable of operation in other sequences than described or illustrated herein.

An example embodiment of a semiconductor device manufactured using a semiconductor substrate is described herein. In one embodiment, the semiconductor device is a MEMS (MicroElectroMechanical Systems) device. In the example embodiment, a single crystalline silicon wafer is used as the semiconductor substrate to describe the formation of a MEMS device in accordance with embodiments of the present disclosure. Other semiconductor substrates such as SOI (Silicon on Insulator), GaAs (Gallium Arsenide), GaN (Gallium Nitride), SiC (Silicon Carbide), InP (Indium Phosphide) among other substrates may also be used in additional embodiments. Semiconductor devices such as MEMS (Micro Electro Mechanical Systems) sensors and actuators, microfluidic devices, optical devices, magnetic devices among other devices may be formed in the semiconductor substrate.

Figure 1:
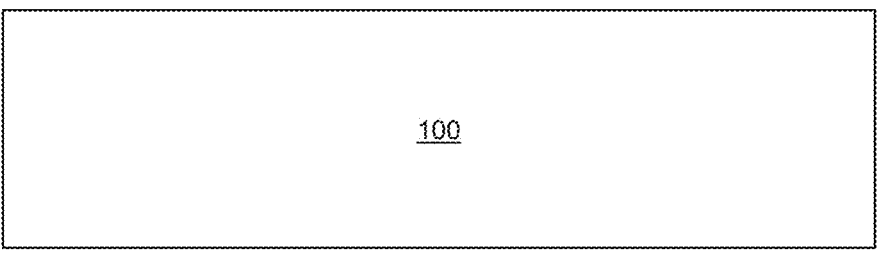
FIG. 1 is an illustration of a semiconductor substrate in accordance with an example embodiment.

FIG. 1 is an illustration of a semiconductor substrate 100 used for the implementation of the semiconductor device in accordance with an example embodiment. In the example embodiment, semiconductor substrate 100 is a monocrystalline or single crystal silicon wafer. In the example embodiment, monocrystalline silicon wafer may have a doped so as to exhibit a bulk resistivity of 0.001 ohm-cm to 10,000 ohm-cm and may be n-type doped or p-type doped and may be doped by dopants such as arsenic, antimony, phosphorus, or boron to name but a few. In the example embodiment, substrate 100 is doped n-type using phosphorus as the dopant.

Figure 2:
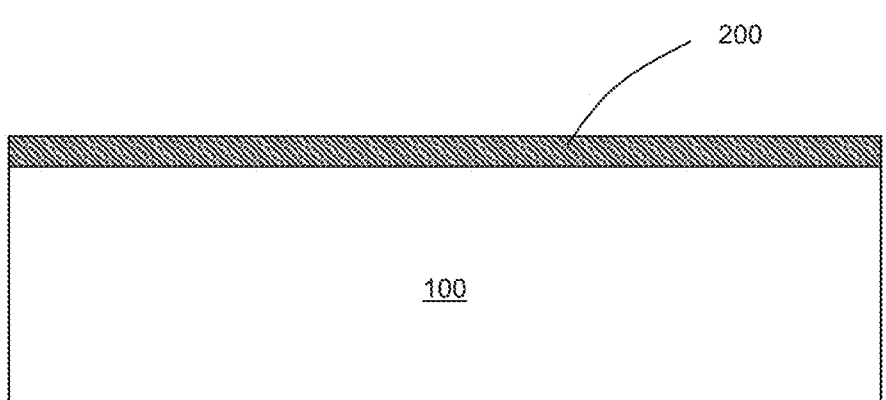
FIG. 2 is an illustration of an intermediate layer overlying the semiconductor substrate in accordance with an example embodiment.

FIG. 2 is an illustration of an intermediate layer 200 overlying semiconductor substrate 100 in accordance with an example embodiment. Intermediate layer 200 comprises a single crystal or monocrystalline layer and is grown overlying semiconductor substrate 100. Intermediate layer 200 comprises a second material different from the material of semiconductor substrate 100. Intermediate layer 200 is grown such that it is relaxed and has no strain or very low strain. Intermediate layer 200 is grown overlying semiconductor substrate 100 by epitaxial growth in a reactor. The conditions of the epitaxial growth are controlled such that intermediate layer 200 is relaxed by varying the thickness, gas precursors, temperatures, ramp rate, flow rates, and other process conditions. Intermediate layer 200 may be relaxed by modulating the growth conditions such that the strain in intermediate layer 200 is relieved by the formation of dislocations by breaking of bonds due to the mismatch of the lattice parameters between the atoms of semiconductor substrate 100 and intermediate layer 200 by growing intermediate layer 200 beyond the critical thickness of the particular growth conditions of temperature and other process parameters. The relaxation of strain may be due to misfit dislocations and threading dislocations and the density of these defects may be in the range of $10^9/cm^2$.

In another embodiment, the strain in intermediate layer 200 may be relieved by introduction of another atom with a different lattice constant to semiconductor substrate 100 in addition to atoms of one kind used in the single crystalline structure of intermediate layer 200. Intermediate layer 200 may comprise epitaxial growth of multiple layers of single crystal semiconductor material with each layer having different growth rates, temperatures, gas precursors, flow rates or changes in other process parameters. Intermediate layer 200 comprising a composite layer formed by growth of multiple layers is relaxed by growth of each layer of the composite beyond the critical thickness. In one embodiment, intermediate layer 200 may be grown by multiple sub-layers of intermediate layer 200 with thermal anneal processes between subsequent epitaxial steps such that the internal strain is relieved by formation of dislocations. Each sub-layer is grown having a thickness beyond the critical thickness such that the subsequent grown sub-layer is grown under reduced internal strain. Intermediate layer 200 may be doped during the epitaxial growth process to modulate the properties of intermediate layer 200 for subsequent processes. Intermediate layer 200 may be doped by introducing dopants during the epitaxial growth process and may be n-type or p-type doped. The thickness of intermediate layer 200 may be in the range of 0.5 microns to 10 microns in thickness and is relaxed with zero strain or very low strain by growing the thickness beyond the critical thickness.

In the example embodiment, intermediate layer 200 comprises single crystal silicon germanium overlying semiconductor substrate 100 comprising single crystal silicon. In the example embodiment, intermediate layer 200 is formed by growing single crystal silicon germanium epitaxially overlying a top surface of single crystal silicon semiconductor substrate 100. The composition of Silicon Germanium (SiGe) may be represented by the formula $Si_{(1-x)}Ge_x$, where "x" represents the mole fraction as a percentage of Germanium (Ge) in the Silicon Germanium (SiGe) alloy. The mole fraction percentage of Ge, represented by "x" may be between 1% to 100%. The fraction of Ge in the $Si_{(1-x)}Ge_x$ alloy may be modulated according to the particular application of intermediate layer 200 in the formation of a semiconductor device. In one embodiment, intermediate layer 200 comprises 30% of Ge in the SiGe alloy.

In the example embodiment, intermediate layer 200 comprising single crystal SiGe is epitaxially grown overlying semiconductor substrate 100 comprising single crystal silicon such that the thickness of SiGe is relaxed with zero strain or very low strain. The composition of SiGe layer may be modulated for different application specific requirements by relaxing intermediate layer 200 by growing it beyond the critical thickness to form dislocations such as misfit dislocations or threading dislocations or a combination of misfit/threading dislocations. The critical thickness for the particular composition of SiGe layer is the thickness below which intermediate layer 200 is strained with limited dislocations and above the critical thickness, the residual strain is relieved by formation of density of dislocations by breaking of bonds in the single crystalline lattice structure leading to a relaxed layer with zero strain or very low strain. The critical thickness of intermediate layer 200 is determined by the composition, growth temperature, gas precursors, flow rates etc., among other factors. In the example embodiment, intermediate layer 200 comprising SiGe may be grown by epitaxial growth of one or more layers of SiGe and by growing each layer beyond the corresponding critical thickness by relaxing the strain by formation of dislocations. In the example embodiment, intermediate layer 200 may comprise 30% Ge in a SiGe layer that is strain free by formation of a density of dislocations to relieve the residual strain.

In some embodiments, the composition of intermediate layer 200 may vary across the thickness of intermediate layer 200. In some embodiments, the composition of intermediate layer 200 may vary in a linear manner while in other embodiments, the composition of intermediate layer 200 may vary in a step wise manner.

Figure 3:
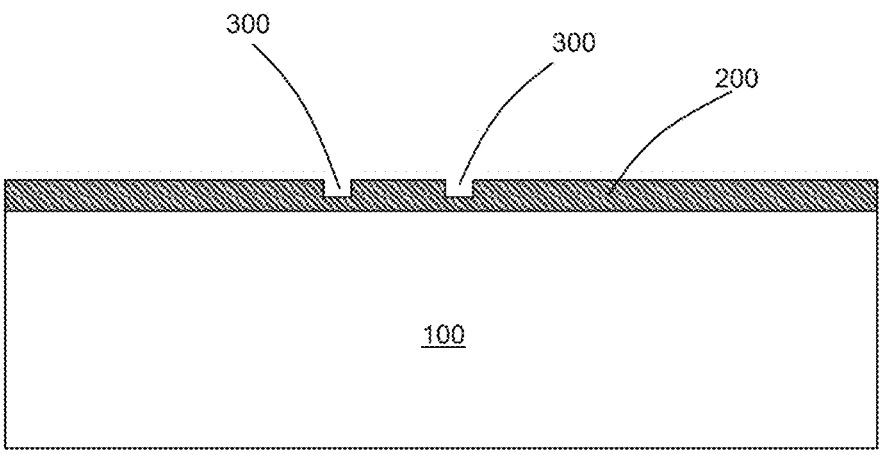
FIG. 3 is an illustration of recessed regions formed in the intermediate layer in accordance with an example embodiment.

FIG. 3 is an illustration of recessed regions 300 formed in intermediate layer 200 in accordance with an example embodiment. Recessed regions 300 are formed by removing a portion of the thickness of intermediate layer 200 selectively in one or more locations, in the formation of a semiconductor device such as a MEMS device. Recessed regions 300 are formed in intermediate layer 200 by using the techniques of lithography and etching, as evident to those skilled in the art. In the example embodiment, recessed regions 300 are formed in intermediate layer 200 comprising silicon germanium overlying semiconductor substrate 100 comprising silicon. Both intermediate layer 200 comprising silicon germanium and semiconductor substrate comprising silicon are single crystal. In an example embodiment, the formation of recessed regions 300 is coupled with the definition of global alignment keys to facilitate formation of MEMS device, as explained in detail herein. Global alignment keys may be formed by etching alignment keys in the perimeter of semiconductor substrate 100. In one embodiment, global alignment keys are etched in semiconductor substrate 100 by using DRIE (Deep Reactive Ion Etching) to form patterned trenches prior to the growth of intermediate layer 200. In another embodiment, global alignment keys are formed by etching patterned trenches in intermediate layer 200 and underlying semiconductor substrate 100. The size, shape and depth of trenches formed by global alignment keys are defined by the requirements of subsequent processing steps as will be evident to those skilled in the art. In an example embodiment, trenches for global alignment keys are etched after growth of intermediate layer 200 comprising silicon germanium overlying semiconductor substrate 100 comprising single crystal silicon. After the formation of trenches for global alignment keys, recessed regions 300 formed in intermediate layer 200 are aligned to the global alignment keys.

In one embodiment, recessed regions 300 are formed by spin-coating the surface of intermediate layer 200 with a photo-sensitive material called photo-resist. A mask with desired pattern of recessed regions 300 is used to transfer the pattern to the photo-resist layer using the technique of lithography with a tool called a stepper or aligner. The pattern of shapes that are transferred to the surface of the photo-resist may be square, round, rectangular, triangular, pentagonal, hexagonal, rhomboid, polygonal, and other shapes and is in the range of (0.5-10) micrometers in size.

Portions of the photo-sensitive material (photo-resist) are selectively removed to form openings and expose surface of intermediate layer 200 using a combination of optical and chemical processes, as will be evident to those skilled in the art. The openings in the photo-resist correspond to recessed regions 300. The exposed surface of intermediate layer 200 in the openings are then etched using an etching process. The etching process used to selectively remove a thickness of intermediate layer 200 may be wet, dry, vapor or a combination of wet, dry and vapor etching. The etching process to form recessed regions 300 may be anisotropic, isotropic or a combination of anisotropic and isotropic. In one embodiment, the selective removal of a thickness of intermediate layer 200 comprising silicon germanium uses RIE (Reactive Ion Etching) with fluorine chemistry (such as SF6). In one embodiment, the depth of recessed regions may be a fraction of the total thickness of intermediate layer 200, depending on the design requirements. The depth of recessed regions 300 may be between (10-90) % of the total thickness of intermediate layer 200. In another embodiment, the etching process used for the formation of recessed regions 300 in intermediate layer 200 comprising silicon germanium uses vapor HCl to selectively remove a thickness of intermediate layer 200 comprising silicon germanium with an isotropic profile. Different combinations of gases and chemicals are used to selectively etch a portion of intermediate layer 200 to form recessed regions 300 depending on the materials used for intermediate layer 200 overlying semiconductor substrate 100. In general, the etching process is configured to etch a predetermined distance into intermediate layer 200 and does not expose substrate 100 when forming recessed regions 300.

Figure 4:
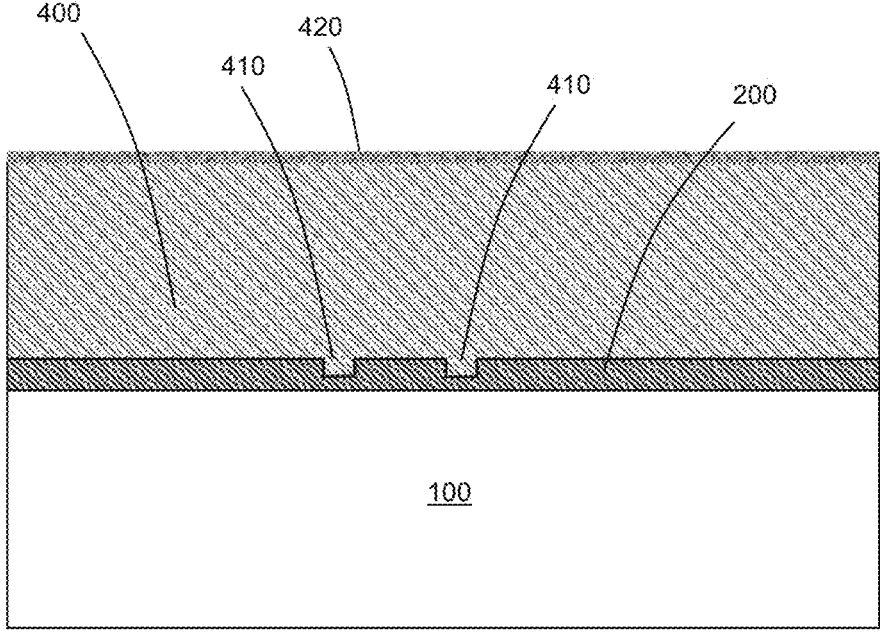
FIG. 4 is an illustration of the device layer with one or more stops overlying the intermediate layer in accordance with an example embodiment.

FIG. 4 is an illustration of a device layer 400 with one or more stops 410 overlying intermediate layer 200 in accordance with an example embodiment. Device layer 400 and stops 410 comprises a single crystal semiconductor material and are epitaxially grown overlying the surface of intermediate layer 200. Device layer 400 can comprise a third material different from the material of intermediate layer 200 and semiconductor substrate 100. In one embodiment, device layer 400 comprises the same material as underlying semiconductor substrate 100. In the example embodiment, device layer 400 and semiconductor substrate 100 comprises single crystal silicon and intermediate layer 200 comprises single crystal silicon germanium.

In the example embodiment, device layer 400 comprises single crystal silicon and is grown such that it is relaxed with zero strain or very low residual strain. As described above, intermediate layer 200 is a single crystalline or monocrystalline layer and is relaxed with zero or very low strain by the growth of the layer to a thickness beyond the critical thickness with formation of a density of dislocations to relieve the strain caused by the mismatch of the lattice constants in intermediate layer 200 and semiconductor substrate 100. Since device layer 400 is epitaxially grown above intermediate layer 200, it is also grown such that it is relaxed with zero or very low strain by the growth of device layer 400 beyond the critical thickness due to the choice of the growth conditions of device layer 400. By growing device layer 400 above a relaxed layer comprising intermediate layer 200 with a density of dislocations to relieve the residual strain, the strain of device layer 400 is similarly relieved by formation of dislocations by growing device layer 400 beyond the critical thickness.

In the example embodiment, device layer 400 comprising single crystal silicon is grown in an epitaxial reactor with precursor gases such as DCS (Dichlorosilane), TCS (Trichlorosilane), $SiH_4$ (Silane) among other precursor gases and at a temperature between 400-1200° C. to enable the formation of single crystal silicon layer overlying the relaxed surface of intermediate layer 200. The gas flow rates, temperatures and thickness of device layer 400 may be modulated to grow the film thickness beyond the critical thickness and is accompanied by the formation of dislocations to form a relaxed device layer 400 with zero or very low strain.

Since the surface of intermediate layer 200 is patterned with one or more recessed regions 300, the growth of device layer 400 in the epitaxial reactor is controlled such that single crystal material comprising device layer 400 grows from the surface in recessed regions 300 to form stops 410 that are single crystal in structure and comprises the third material used for the epitaxial growth of device layer 400. In the example embodiment, device layer 400 comprises single crystal silicon and stops 410 comprises single crystal silicon overlying intermediate layer 200 comprising single crystal silicon germanium. In the example embodiment, stops 410 have a portion of intermediate layer 200 between stops 410 and substrate 100.

Device layer 400 may be grown as an undoped or doped layer depending on the application. In one embodiment, device layer 400 may be formed as a single crystal silicon layer which is doped. The doping of device layer 400 is achieved by flowing dopant gases such as arsine, phosphine, diborane along with precursor gases such as DCS and TCS to dope device layer 400 n-type or p-type depending on the doping type required for the formation of the semiconductor device. The sheet resistance of the doped layer forming device layer 400 may be in the range of (0.001-10,000) ohm-cm and may be n-type or p-type.

The thickness of device layer 400 with zero or very low strain due to the density of dislocations may be in the range of 1-200 microns and may be formed in one or multiple epitaxial deposition steps such that the critical thickness of each sub-layer of device layer 400 is exceeded for the particular growth conditions. The growth conditions of device layer 400 is controlled such that recessed regions 300 in intermediate layer 200 are filled with single crystal growth of device layer 400 to form stops 410. The number of steps of epitaxial growth may vary from one to 100 steps and each epitaxial growth step produces a strain free layer due to formation of dislocations. In some embodiments, intermediate annealing steps may be used between deposition steps to reduce residual strain in addition to formation of dislocations. The temperature and time of each deposition and annealing step may be varied to reduce the residual strain and also the surface roughness. Since dislocations are intentionally created in device layer 400 to relieve the residual strain, the misfit and threading dislocations that are created contribute to a surface roughness 420 on the surface of device layer 400, as shown in FIG. 4. Surface roughness 420 on the surface of device layer 400 are due to the density of dislocations produced by the strain relaxation leading to zero or very low strain and has an average roughness of between (2-100) nm depending on the starting surface roughness of intermediate layer 200 and the growth conditions of device layer 400.

The epitaxial growth process used for formation of device layer 400 overlying intermediate layer 200 also transfers the global alignment keys formed in intermediate layer 200 by growing single crystal material of device layer 400 on the sidewalls and top of the trenches formed in intermediate layer 200. The size and shape of the trenches for the global alignment keys enables the transfer of the global alignment keys to the surface of device layer 400 for subsequent device processing steps as described subsequently herein.

Figure 5:
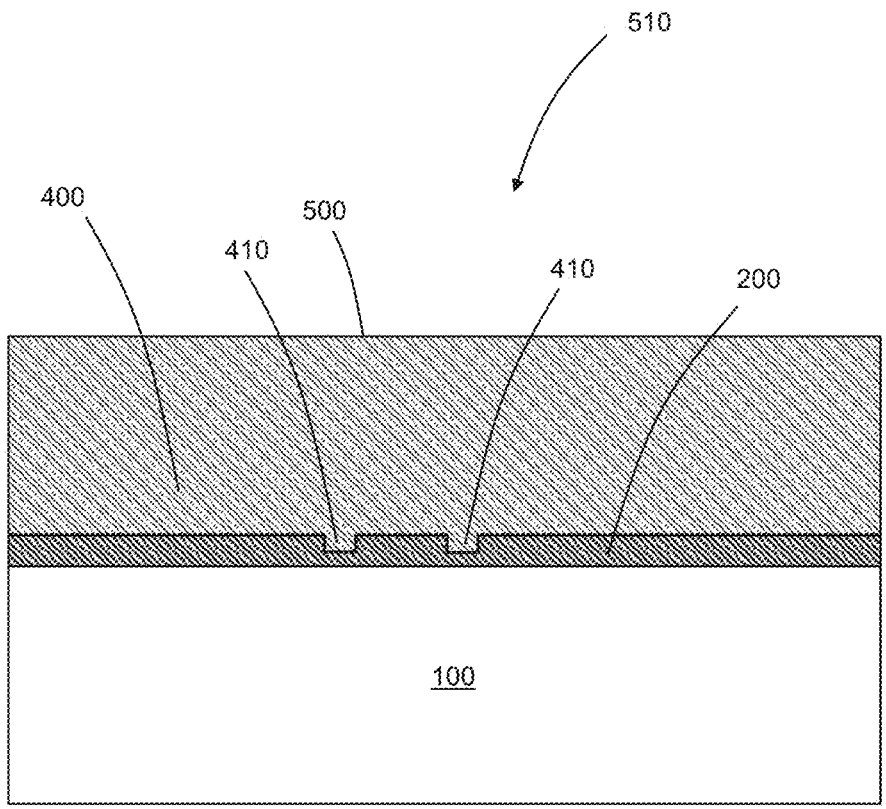
FIG. 5 is an illustration of the device layer with the layer of surface roughness of FIG. 4 removed by polishing using Chemical Mechanical Polishing (CMP) in accordance with an example embodiment.

FIG. 5 is an illustration of device layer 400 with the layer of surface roughness 420 of FIG. 4 removed by polishing using Chemical Mechanical Polishing or Planarization (CMP) in accordance with an example embodiment. In the example embodiment, device layer 400 comprises single crystal silicon having the layer of surface roughness 420 as shown in FIG. 4. In one embodiment, the surface of device layer 400 can have an average roughness of (10-100) nanometers. A CMP step is utilized to remove the surface roughness to an average surface roughness below 10 Angstroms resulting in a planarized surface 500 for device layer 400. This surface finish of device layer 400 comprising single crystal silicon in the example embodiment has an optical finish suitable for lithography processes as described in subsequent steps for the formation of a semiconductor device. Referring briefly to FIG. 4, planarized surface 500 is the result of the polishing CMP step described herein applied to the surface of device layer 400 after the epitaxial growth process.

An engineered substrate 510 is formed comprising semiconductor substrate 100, intermediate layer 200 and device layer 400 with stops 410 in accordance with an example embodiment. In the example embodiment, semiconductor substrate 100 of engineered substrate 510 is a first material comprising single crystal silicon. In the example embodiment with engineered substrate 510, intermediate layer 200 comprises a second material of single crystal SiGe that is relaxed and strain free and has a density of dislocations by growing the thickness beyond the critical thickness. In the example embodiment, device layer 400 comprises a third material of single crystal silicon that is relaxed and strain free and has a density of dislocations by growing the thickness beyond the critical thickness. Device layer 400 further comprises stops 410 of single crystal silicon that is relaxed and strain free.

Figure 6:
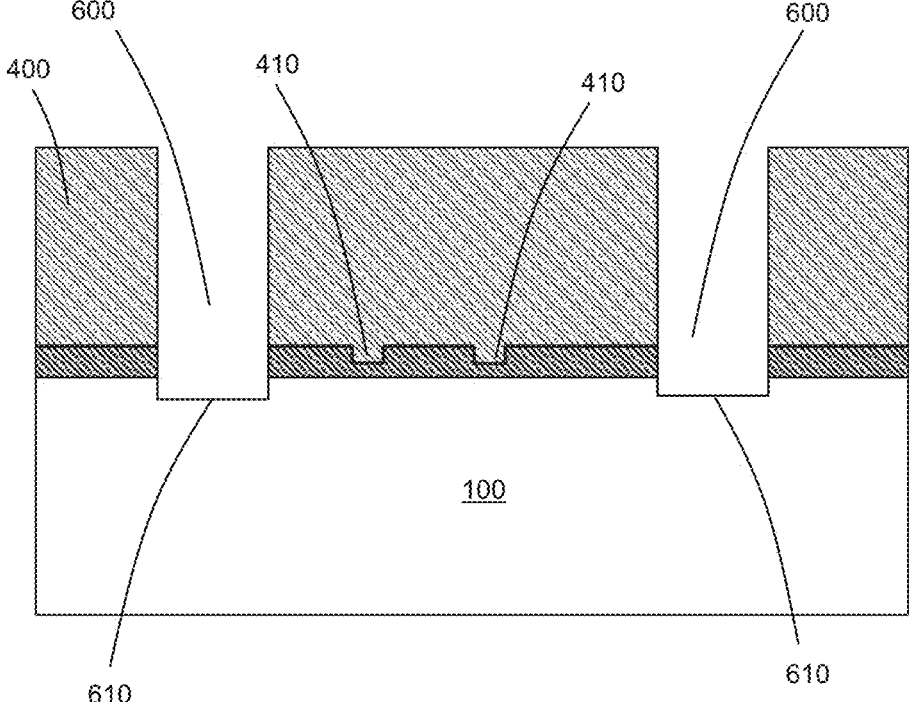
FIG. 6 is an illustration of openings or voids formed in the device layer and intermediate layer in accordance with an example embodiment.

FIG. 6 is an illustration of openings or voids 600 formed in device layer 400 and intermediate layer 200 in accordance with an example embodiment. In one embodiment, photolithography is used to define and pattern the voids 600 formed in device layer 400 and intermediate layer 200. A mask is used to ensure that the pattern for formation of voids 600 are aligned to the global alignment keys that are transferred to the planarized surface of device layer 400.

Voids 600 formed in device layer 400 and intermediate layer 200 are patterned using high aspect ratio etching techniques such as DRIE (Deep Reactive Ion Etching). Voids 600 in device layer 400 and intermediate layer 200 may be achieved in one etching process or two separate etching processes using different etching methods and chemistries, depending on the material used for formation of device layer 400 and intermediate layer 200.

In the example embodiment, regions of device layer 400 exposed by patterned photoresist layer are etched to form high aspect ratio trenches in device layer 400 comprising single crystal silicon by using DRIE (Deep Reactive Ion Etching) process using $SF_6$ chemistry and alternate cycles of etch using $SF_6$ and passivation using a polymer to form high aspect ratio trenches. In the example embodiment, intermediate layer 200 comprising SiGe is then patterned using the same DRIE process to remove portions of intermediate layer 200 to expose surface 610 of semiconductor substrate 100 comprising silicon crystal silicon. In the example embodiment, surface 610 at the bottom of voids 600 is the surface of semiconductor substrate 100 comprising silicon crystal silicon. As shown, the surface 610 of voids 600 may be recessed into semiconductor substrate 100. In one embodiment, the depth of the recess in semiconductor substrate 100 corresponding to surface 610 of exposed regions of semiconductor substrate 100 may be in the range of (0.5-5) microns below the majority surface of semiconductor substrate 100.

Figure 7:
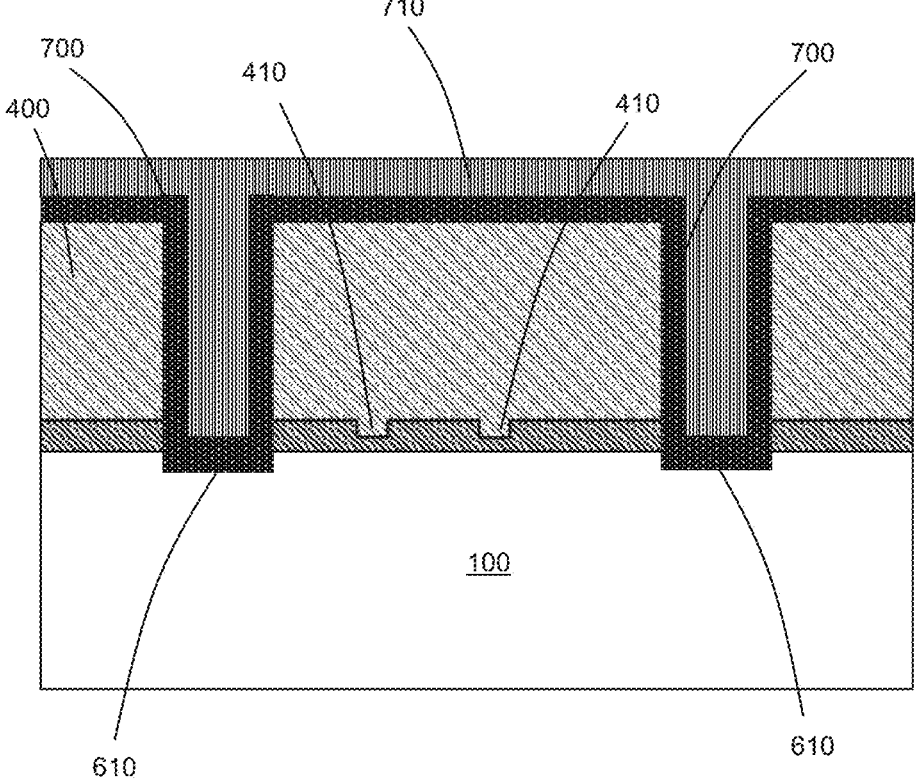
FIG. 7 is an illustration of a refill of the voids by deposition of one or more layers in accordance with an example embodiment.

FIG. 7 is an illustration of the refill of voids 600 of FIG. 6 by deposition of one or more layers in accordance with an example embodiment. In the example embodiment, voids 600 of FIG. 6 formed in device layer 400 and intermediate layer 200 with surfaces 610 on or below surface of semiconductor substrate 100 are refilled by deposition of one or more layers of semiconductor material. The deposition method used for the refill of voids 600 of FIG. 6 may comprise CVD (Chemical Vapor Deposition), ALD (Atomic Layer Deposition), reactive growth such as oxidation and other deposition methods. The deposition methods for the refill of voids 600 of FIG. 6 are preferably conformal such that voids 600 of FIG. 6 are refilled completely or refilled with small internal voids. The refill of voids 600 of FIG. 6 may be achieved with one or multiple layers depending on the choice of materials and the dimensions of voids 600 of FIG. 6. The refill process used for voids 600 of FIG. 6 enables one or more refill layers to be in contact with surface 610 of exposed regions of semiconductor substrate 100 in the bottom of voids 600 of FIG. 6.

In the example embodiment, voids 600 of FIG. 6 are etched through device layer 400 comprising single crystal silicon and etched through intermediate layer 200 comprising Silicon Germanium. In the example embodiment, voids 600 of FIG. 6 are refilled with two refill layers. In the example embodiment, the first refill layer comprises a layer 700 which is a dielectric material, and the second refill layer comprises a layer 710 of a fourth material.

In the example embodiment, layer 700 comprises LPCVD silicon nitride which is deposited conformally over the surface of device layer 400, sidewalls of voids 600 of FIG. 6 in device layer 400 and intermediate layer 200 and surfaces 610 of exposed regions on surface of semiconductor substrate 100. In the example embodiment, layer 700 is a first layer of dielectric material comprising LPCVD low stress, silicon rich silicon nitride and the thickness is between (0.5-1.5) microns.

In the example embodiment, layer 710 used as the second refill layer for refilling voids 600 of FIG. 6 comprises LPCVD polycrystalline silicon or polysilicon. Layer 710 comprising LPCVD polycrystalline silicon conformally deposits over a surface of the first refill layer comprising layer 700 of silicon nitride which is electrically insulating or a dielectric. The polycrystalline silicon used as layer 710 may be undoped or doped and may have a thickness of (0.5-5) microns. The thickness of layer 710 is dependent on the width of voids 600 of FIG. 6 and thickness of layer 700 used as the first refill layer such that voids 600 of FIG. 6 are completely refilled. In another embodiment, voids 600 of FIG. 6 are completely refilled by deposition of a single refill layer comprising layer 700 which is a dielectric. In another embodiment, voids 600 of FIG. 6 may be completely refilled by deposition of a second layer comprising a second LPCVD silicon nitride layer over the first dielectric layer comprising silicon nitride. In another embodiment, multiple refill layers may be used to completely refill voids 600 of FIG. 6. In another embodiment, layer 710 used as the second refill layer may comprise LPCVD LTO (Low Temperature Oxide), HTO (High Temperature Oxide), TEOS (TetraEthylOrthoSilicate), among other oxide films. In another embodiment, layer 710 used as the second refill layer comprises SACVD (Sub Atmospheric Chemical Vapor Deposition) oxide.

Figure 8:
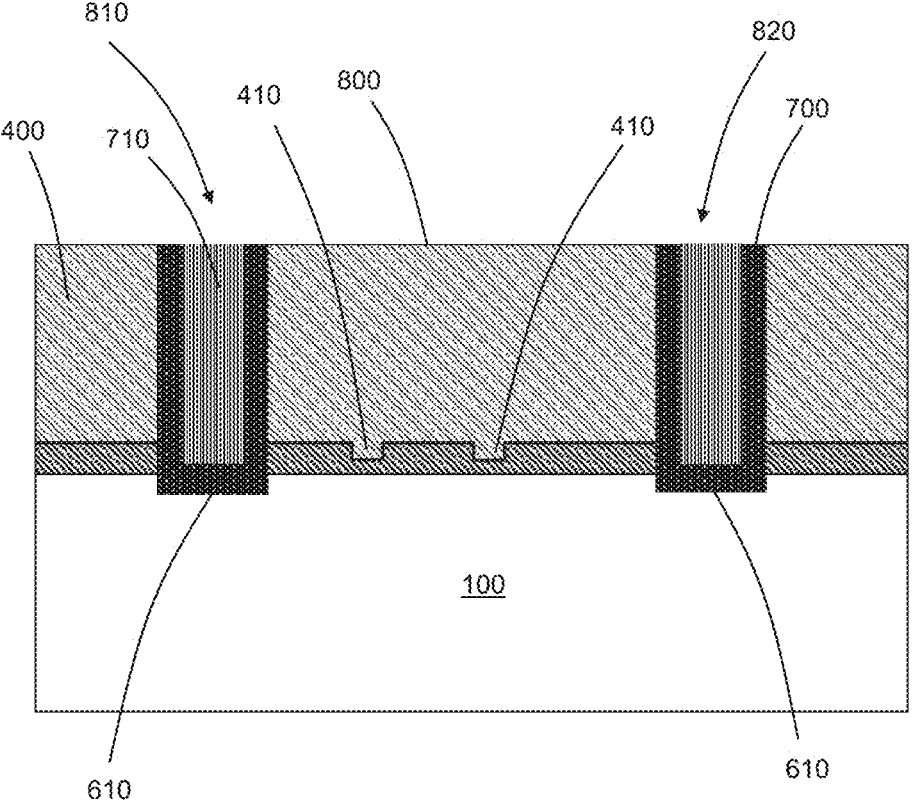
FIG. 8 is an illustration showing the formation of anchor structures in accordance with an example embodiment.

FIG. 8 is an illustration showing the formation of anchor structures 810 and 820 in accordance with an example embodiment. Anchor structures 810 and 820 are formed by removal of layer 710 and layer 700 from FIG. 7 using CMP (Chemical Mechanical Polishing) to expose surface 800 of device layer 400. A predetermined thickness of device layer 400 may also be removed by the CMP process to form surface 800. Anchor structures 810 and 820 comprise layer 700 as a dielectric material and layer 710 as a refill layer and are coupled to semiconductor substrate 100 at surface 610 which may be at or below the surface of semiconductor substrate 100 as disclosed herein. Anchor structures 810 and 820 are coupled to semiconductor substrate 100 by surface 610 with layer 700 and 710 of FIG. 7.

Figure 9:
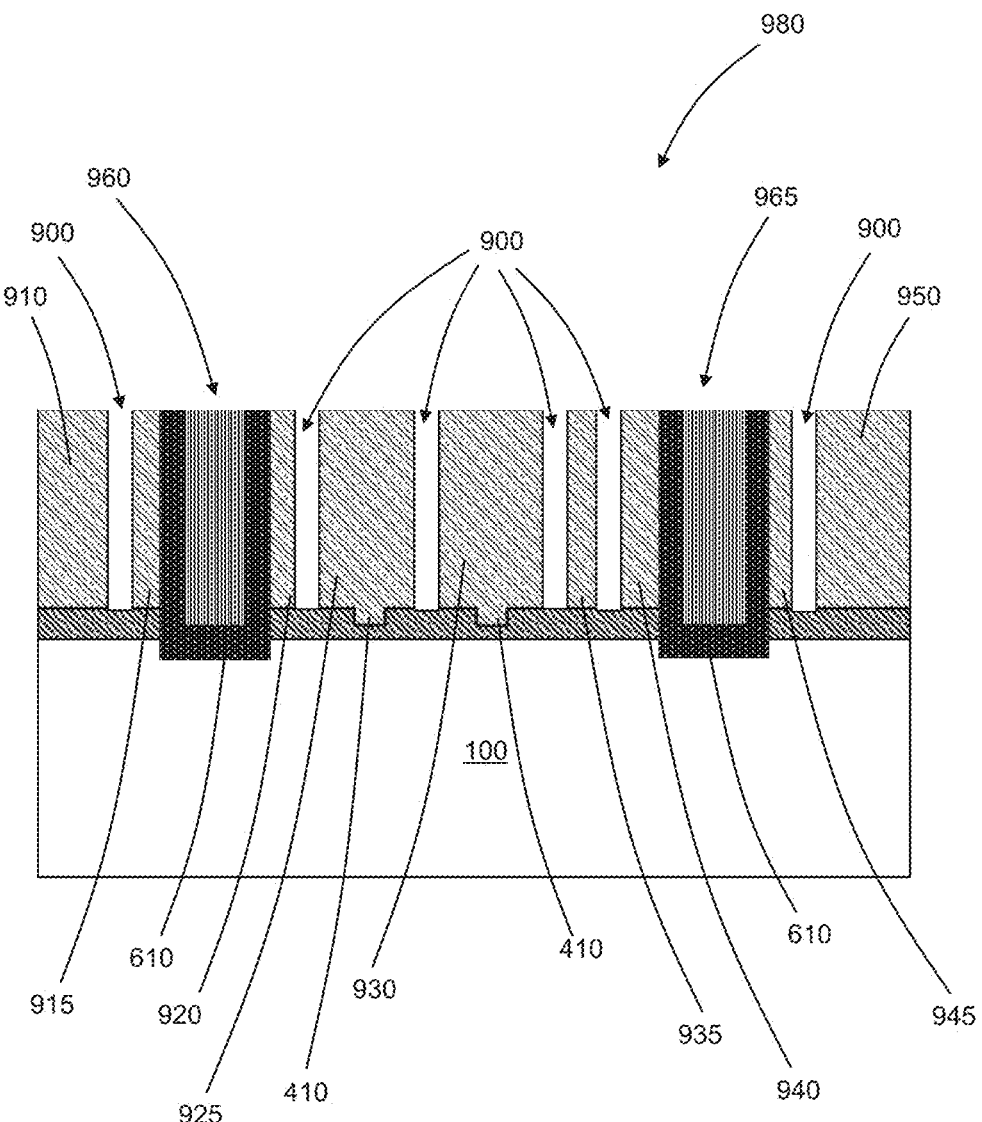
FIG. 9 is an illustration showing openings formed in the device layer in accordance with an example embodiment.

FIG. 9 is an illustration showing openings 900 formed in device layer 400 in accordance with an example embodiment. Openings 900 are formed in device layer 400 to enable formation of a semiconductor device 980. In the example embodiment, semiconductor device 980 comprises a MEMS (Micro Electro Mechanical Systems) device formed in device layer 400, intermediate layer 200 and semiconductor substrate 100. In the example embodiment, openings 900 are formed using the techniques of lithography and etch processes as well known to those skilled in the art. The pattern of openings 900 are transferred to the surface of a photoresist that is selectively exposed to UV (ultraviolet) light using a lithography tool such as a stepper or aligner using a mask or reticle. The transferred pattern in the photoresist is then used to selectively etch trenches in device layer 400 to expose portions of intermediate layer 200 at the bottom of openings 900. In the example embodiment, DRIE (Deep Reactive Ion Etching) is used to form openings 900 forming an array of trenches with high aspect ratio, where the trench openings are smaller than the height of the trenches. The aspect ratio (height to width) of openings 900 may be in the range of 5:1 to 60:1. In the example embodiment, the aspect ratio of openings 900 is in the range of 10:1. In the example embodiment, openings 900 enables the formation of patterned device layer 910, 915, 920, 925, 930, 935, 940, 945, and 950. Different combinations of the array of patterned device layer (910-950) may be used in the formation of different semiconductor devices. In general, the MEMS device has a moving mass including at least one stop that limits movement of the moving mass in a predetermined direction. In one embodiment, the at least one stop reduces stiction such that the moving mass can return to a quiescent condition should it exceed the limit and briefly contact the semiconductor substrate or other stationary structure. In the example embodiment, semiconductor device 980 is a MEMS device and more specifically an accelerometer sensor or accelerometer that detects acceleration due to inertial force.

In FIG. 9, openings 900 enable formation of anchors 960 and 965 that are attached to semiconductor substrate 100. Using openings 900, anchor 960 is formed by patterned device layer 915 and 920 attached to anchor structure 810 of FIG. 8 comprising layer 700 and layer 710. Anchor 960 as disclosed is attached to the surface of semiconductor substrate 100. In the example embodiment, patterned device layer 915 and 920 comprises single crystal silicon, and semiconductor substrate 100 comprises single crystal silicon. Similarly, using openings 900, anchor 965 is formed by patterned device layer 940 and 945 attached to anchor structure 820 of FIG. 8 comprising layer 700 and layer 710 and attached to surface of semiconductor substrate 100. In the example embodiment, patterned device layer 940 and 945 comprises single crystal silicon, and semiconductor substrate 100 comprises single crystal silicon.

Figure 10:
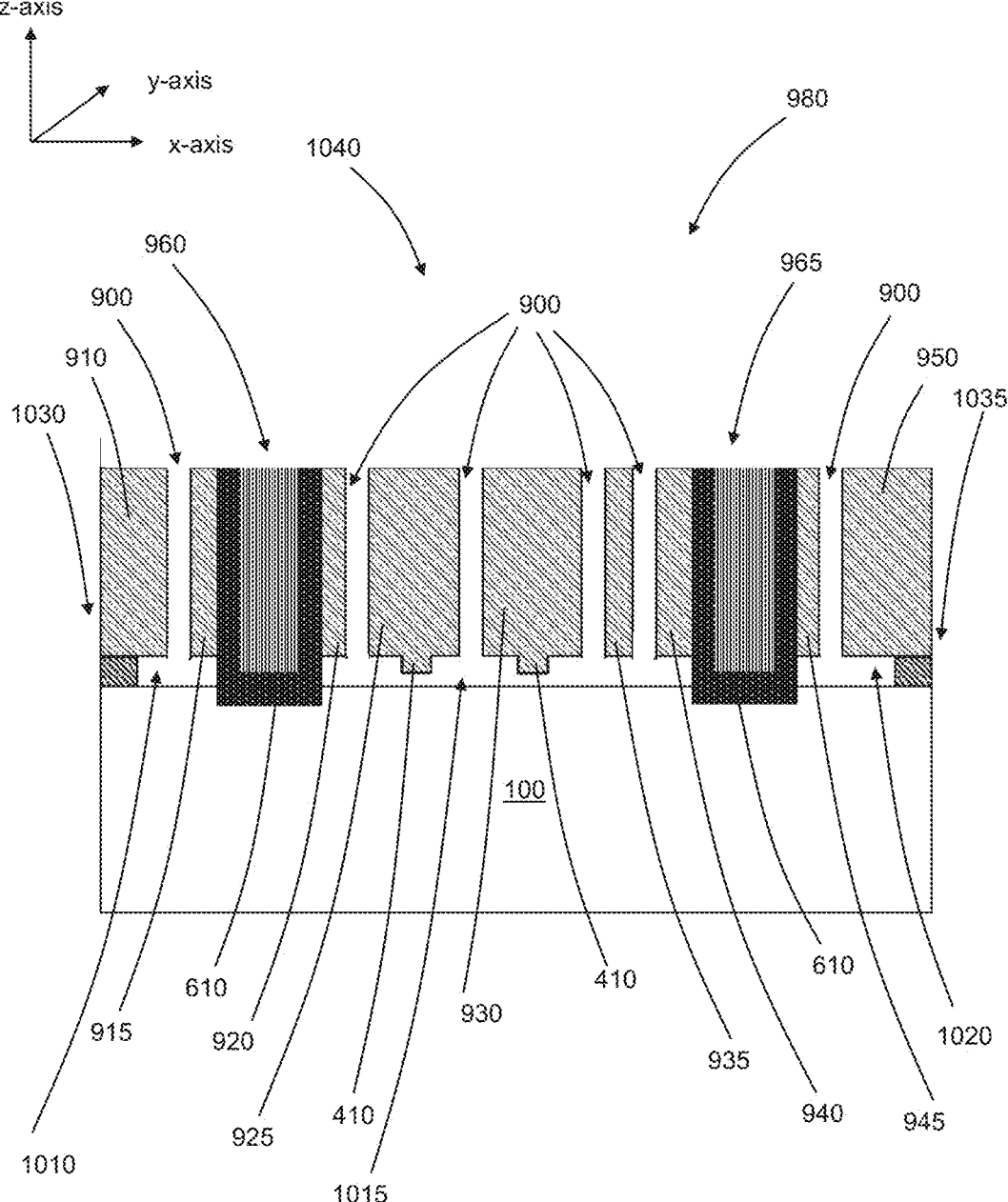
FIG. 10 is an illustration of a semiconductor device formed in accordance with an example embodiment.

FIG. 10 is an illustration of semiconductor device 980 formed in accordance with an example embodiment. In the example embodiment, semiconductor device 980 is a MEMS device and more specifically an accelerometer sensor that detects acceleration due to inertial force in the z-axis. In FIG. 10, openings 900 formed in device layer 400 are used to selectively remove portions of intermediate layer 200 while selectively being attached to semiconductor substrate 100 with anchors 960 and 965.

In the example embodiment, openings 900 in device layer 400 comprising single crystal silicon are used to introduce etchants to selectively remove portions of intermediate layer 200 comprising single crystal silicon germanium to form undercut regions 1010, 1015 and 1020 below device layer 400 by removing portions of intermediate layer 200. In undercut region 1015, portion of intermediate layer 200 comprising silicon germanium below stops 410 is removed by the etchant forming the predetermined distance below stops 410 from surface of semiconductor substrate 100. The etchant that is used to remove portions of intermediate layer 200 is highly selective to device layer 400 and semiconductor substrate 100 and the etching process may use wet, dry, vapor or gaseous etchant. In the example embodiment, vapor hydrochloric acid (HCl) is used to selectively etch portions of intermediate layer 200 comprising single crystal SiGe through openings 900 in device layer 400 comprising single crystal silicon forming undercut regions 1010, 1015 and 1020 forming a gap between portions of patterned device layer (910-950) and semiconductor substrate 100 comprising single crystal silicon. Vapor HCl may be diluted with a carrier gas such as hydrogen, nitrogen, argon among carrier gases and the etching pressure may be in vacuum or in atmospheric pressure. The temperature at which the etching of intermediate layer 200 is carried out may be in the range of 250-1100° C. and the flow rate of the gases may be modified to achieve the desired etch rate and selectivity.

It will be evident that the removal of intermediate layer 200 below device layer 400 results in undercut regions 1010, 1015, and 1020. In undercut region 1015, the removal of intermediate layer 200 below stops 410 results in a gap that is smaller than the thickness of intermediate layer 200 that is removed by the release etch process. Stops 410 in device layer are separated from the underlying semiconductor substrate 100 by a smaller gap than the thickness of intermediate layer 200 and corresponds to a predetermined distance of separation between device layer 400 and semiconductor substrate 100.

In FIG. 10, the removal of intermediate layer 200 in undercut regions 1010, 1015 and 1020 also forms field regions 1030 and 1035 which comprise portions of device layer 400 and intermediate layer 200. Field region 1030 comprise patterned device layer 910 coupled to portion of intermediate layer 200 adjacent to undercut region 1010 and field region 1035 comprise patterned device layer 950 coupled to portion of intermediate layer 200 adjacent to undercut region 1020.

In one embodiment, anchor 960 is physically attached to surface of semiconductor substrate 100 and electrically isolated from semiconductor substrate 100. In one embodiment, this is achieved by anchor structure 810 of FIG. 8 comprising portion of layer 700 comprising a dielectric layer and layer 710 comprising a refill layer and patterned device layer 915 and 920. In the example embodiment, anchor 960 and anchor 965 is attached to semiconductor substrate 100 below the surface of semiconductor substrate 100 thereby increasing the structural strength of anchors 960 and 965.

A moving mass 1040 of the accelerometer comprising patterned device layer 925, 930 and 935 is coupled to anchor 965 that is physically attached to the surface or below the surface of semiconductor substrate 100. Anchor 965 is electrically isolated from semiconductor substrate 100 by anchor structure 820 of FIG. 8 comprising portion of layer 700 comprising a dielectric layer and layer 710 comprising a refill layer and patterned device layer 940 and 945. Moving mass 1040 is free to move under the stimulus of an inertial force such as acceleration since the underlying portion of intermediate layer 200 is removed by formation of undercut regions 1010, 1015 and 1020.

Different techniques for detection of the motion of moving mass may be used to detect the inertial stimulus. Transduction methods such as capacitance detection, piezoelectric, piezoresistive, resonant frequency, optical among other transduction techniques may be used for the accelerometer. In the example embodiment, semiconductor device 980 comprises a z-axis accelerometer that uses capacitive transduction to detect the input acceleration in the z-axis. Moving mass 1040 comprises anchor 965 attached to a suspension spring comprising portion of patterned device layer 935. The suspension spring enables the movement of moving mass 1040 and is coupled to a proof mass comprising portion of patterned device layer 925 and 930. The proof mass forms an array of electrodes represented by portion of patterned device layer 925. When the input acceleration causes the movement of moving mass 1040 vertically for a z-axis accelerometer, the overlap between electrode represented by patterned device layer 925 and portion of patterned device layer 920 of anchor 960 changes and causes a change in the capacitance. The change in capacitance due to the change in the overlap represents the input acceleration and is further converted to the electrical domain to produce an output signal that is representative of the input acceleration.

In FIG. 10, the movement of moving mass 1040 downwards due to an input acceleration in the −z direction results in a proof mass comprising patterned device layer 925 and 930 moving closer to surface of underlying semiconductor substrate 100. Since the portion of proof mass comprising patterned device layers 925 and 930 has protruding regions of vertical stops 410, the reduced gap between vertical stops 410 and underlying semiconductor substrate 100 prevents entire surface of portion of proof mass from coming into contact with underlying semiconductor substrate 100. The predetermined distance between stops 410 and underlying semiconductor substrate 100 acts as a motion stop for portion of proof mass of moving mass 1040 and restricts the maximum distance of travel due to an input acceleration in the −z direction to the predetermined distance defined by the gap between stops 410 and underlying semiconductor substrate 100. Stops 410 also enables the z axis accelerometer to prevent the phenomenon of stiction by reducing the contact area of proof mass of moving mass 1040 to the areas of stops 410 that come into contact with the surface of underlying semiconductor substrate 100.

In a MEMS device such as a 3-axis accelerometer or gyroscope, vertical stops 410 may be used to limit motion in the vertical axis due to acceleration, shock, vibration and other inertial forces. The formation of stops 410 in the moving mass with predetermined distance of motion enables the limitation of the motion of the moving mass of the inertial sensor. In another embodiment, moving mass 1040 may be an actuator that can move in the vertical direction due to a stimulus. In one embodiment, moving mass 1040 may be a mirror that can move or rotate in the z-axis.

Figure 11:
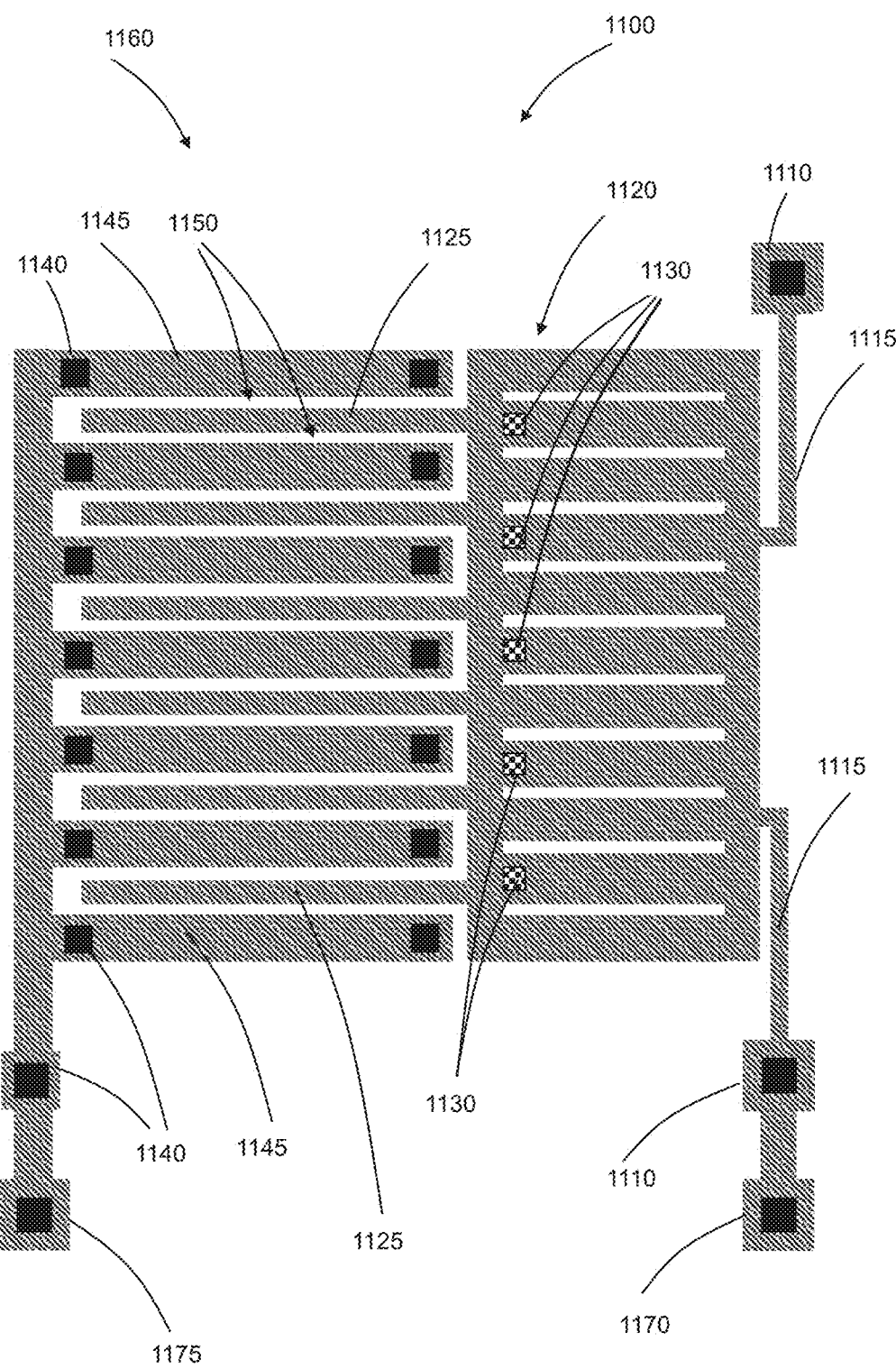
FIG. 11 is an illustration of a MEMS device formed in accordance with an example embodiment.

FIG. 11 is an illustration of a MEMS device 1100 formed in accordance with an example embodiment. In the example embodiment, MEMS device 1100 is the top view of a torsional accelerometer capable of sensing acceleration orthogonal to the plane of the device (in the z-axis) in accordance with the example embodiment. Note that a single structure may be identified on the figure directly, but it can be replicated multiple times and is understood to be labeled accordingly. In FIG. 11, MEMS device 1100 is a torsional accelerometer with capacitive sensing that comprises a moving element and a static element formed in device layer 1160 of an engineered substrate comprising single crystal silicon that is relaxed and strain free overlying an intermediate layer comprising single crystal SiGe that is relaxed and strain free overlying a semiconductor substrate comprising single crystal silicon. In the example embodiment, the moving element comprises a proof mass 1120 coupled to a spring suspension 1115 which is coupled to an anchor 1110. Moving electrodes 1125 are coupled to proof mass 1120, spring suspension 1115, and anchor 1110 to form the moving mass of the torsional accelerometer of MEMS device 1100 of the example embodiment. To limit vertical motion of proof mass 1120, an array of stops 1130 are formed on the underside of proof mass 1120 formed using device layer 1150 as described in FIGS. 1-10). The torsional accelerometer also comprises a static element comprising an array of static electrodes 1145 supported by an array of anchors 1140. Static electrodes 1145 and moving electrodes 1125 are separated by small lateral gaps 1150 to form a capacitive sensor capable of measuring vertical acceleration. When an inertial force acts on the torsional accelerometer in the −z direction, proof mass 1120 moves in the −z direction due to the torsional rotation of spring suspension 1115 supported by anchor 1110. The movement of proof mass 1120 also causes movement of array of moving electrodes 1125 in the −z direction, causing a change in the overlap of moving electrodes 1125 relative to static electrodes 1145. The movement of moving electrodes 1125 due to the inertial force relative to array of static electrodes 1145 causes a change in the capacitance which is a measure of the input vertical acceleration. The movement of proof mass 1120 due to an input vertical acceleration is limited by the presence of stops 1130 since the gap spacing of device layer 1150 to the underlying semiconductor substrate is smaller than the gap spacing of moving electrodes 1125 from the surface of corresponding underlying semiconductor substrate.

In the example embodiment, anchor 1110 coupled to moving electrodes is connected to a contact pad 1170. Anchor 1140 coupled to array of static electrodes 1145 is connected to contact pad 1175. Contact pad 1170 is electrically coupled to the capacitance plate of moving electrodes 1125. Contact pad 1175 is electrically coupled to the capacitance plate of static electrodes 1145 and the differential capacitance is electrically read and analyzed by an external circuit using as ASIC (Application Specific Integrated Circuit) to convert the input acceleration to an external equivalent electrical signal such as voltage.

An alternate embodiment for the formation of vertical stops for a MEMS device is described with an example embodiment.

Figure 12:
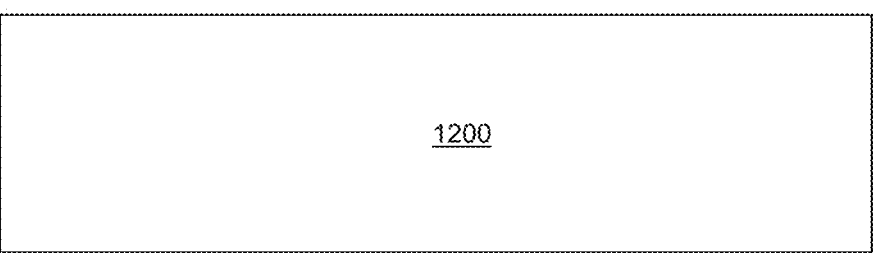
FIG. 12 is an illustration of a semiconductor substrate in accordance with an example embodiment.

FIG. 12 is an illustration of a semiconductor substrate 1200 in accordance with an example embodiment. Semiconductor substrate 1200 is single crystal and may comprise of different materials such as silicon, SOI, germanium, GaN, SiC, GaAs among other materials used for the fabrication of semiconductor devices including MEMS devices.

Figure 13:
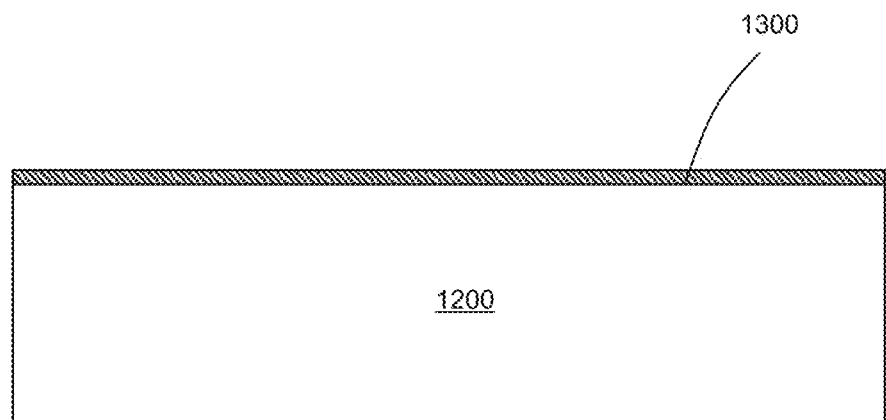
FIG. 13 is an illustration of a first layer of an intermediate layer formed on a surface of the semiconductor substrate in accordance with an example embodiment.

FIG. 13 is an illustration of a first layer 1300 of an intermediate layer formed overlying a surface of semiconductor substrate 1200 in accordance with an example embodiment. In the example embodiment, layer 1300 comprises a second material different from the material of semiconductor substrate 1200. In one embodiment, layer 1300 is deposited on the surface of semiconductor substrate 1200 in an epitaxial reactor and is grown such that the critical layer thickness for the particular growth conditions is exceeded resulting in a layer that is relaxed and strain free with a density of dislocations. In the example embodiment, layer 1300 comprises SiGe with a germanium concentration between 10-80% and has a thickness between (0.2-2) micrometers. In one embodiment, layer 1300 comprises SiGe with 30% Germanium and has a thickness of 0.5 micrometers.

Figure 14:
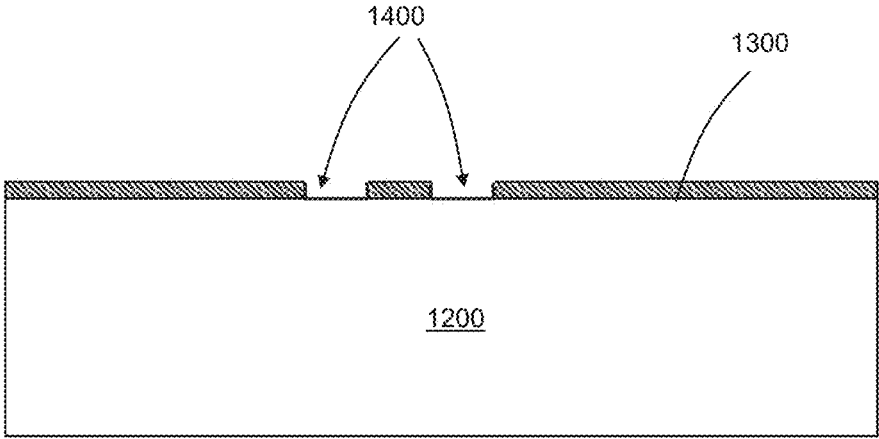
FIG. 14 is an illustration of recessed regions formed in the first layer of an intermediate layer in accordance with an example embodiment.

FIG. 14 is an illustration of recessed regions 1400 in layer 1300 in accordance with an example embodiment. Recessed regions 1400 are formed in layer 1400 of the intermediate layer. As previously mentioned, layer 1300 comprises the second material which differs from semiconductor substrate 1200. In one embodiment, recessed regions 1400 in layer 1300 expose the surface of underlying semiconductor substrate 1200. In the example embodiment, recessed regions 1400 are formed in layer 1300 comprising Silicon Germanium overlying semiconductor substrate 1200 comprising single crystal silicon. Recessed regions 1400 are formed in layer 1300 by using the techniques of lithography and etch. Openings in a mask as used to transfer the pattern to form recessed regions 1400 to the surface of a photosensitive layer using an optical alignment tool such as a stepper or contact aligner. The openings in the photosensitive layer are then used to selectively remove portions of layer 1300 using an etch process which may be wet, dry, vapor, gaseous or a combination of processes. In the example embodiment, a dry etch process using RIE is used to remove portions of layer 1300 comprising silicon germanium to expose surface of semiconductor substrate 100 comprising single crystal silicon.

Figure 15:
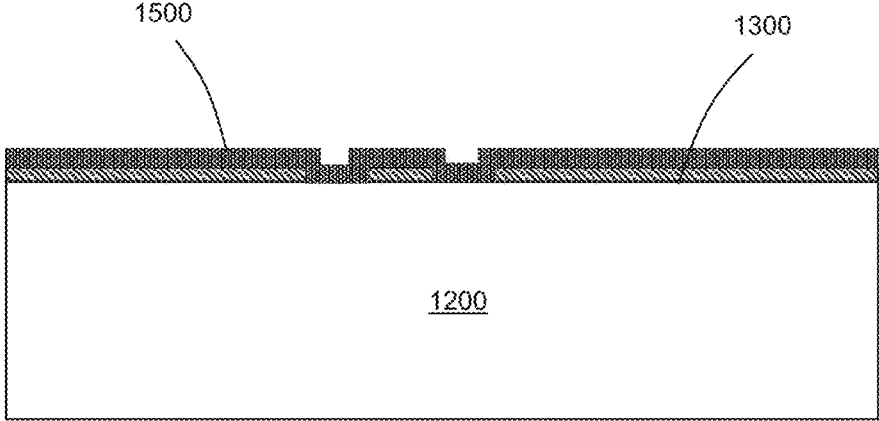
FIG. 15 is an illustration of a second layer of the intermediate layer formed over the recessed regions in accordance with the example embodiment.

FIG. 15 is an illustration of a second layer 1500 of the intermediate layer formed over recessed regions 1400 in accordance with an example embodiment. In the example embodiment, second layer 1500 is grown overlying a surface of layer 1300 of the intermediate layer. In one embodiment, layer 1500 comprises the second material and is grown in a conformal manner such that it grows on the surface of recessed regions 1400. In the example embodiment, second layer 1500 comprises silicon germanium and is grown in an epitaxial reactor. The growth conditions of second layer 1500 comprising silicon germanium enables the layer to be relaxed and strain free with a density of dislocations by growing it beyond the critical thickness for the particular growth conditions. The thickness of second layer 1500 of the second material is in the range of (0.5-2) micrometers and fills the opening of recessed regions 1400 with a predetermined thickness corresponding to the thickness of second layer 1500 of the second material. Thus, in the example embodiment, the intermediate layer comprises layers 1300 and 1500. In general, the intermediate layer can comprise two or more layers that are formed relaxed and can comprise different materials.

Figure 16:
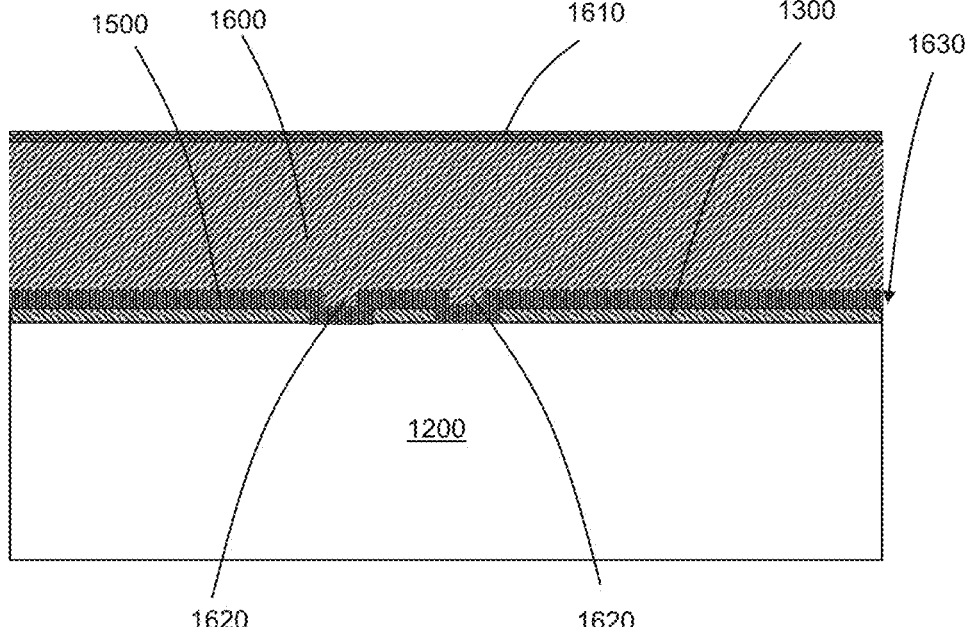
FIG. 16 is an illustration of a device layer of a third material overlying the intermediate layer in accordance with an example embodiment.

FIG. 16 is an illustration of a device layer 1600 of a third material overlying the intermediate layer in accordance with an example embodiment. Device layer 1600 is grown overlying surface of second layer 1500 in an epitaxial reactor. The growth conditions in the epitaxial reactor are controlled such that device layer 1600 grows in portions of recessed regions 1400 of FIG. 14 to form stops 1620 for a device subsequently formed. Device layer 1600 comprises a third material and is single crystal and is grown such that it is relaxed and strain free with a density of dislocations. Device layer 1600 is grown in the epitaxial reactor beyond the critical thickness for the particular growth conditions resulting in a layer that is relaxed and strain free due to the formation of density of dislocations in the crystal structure. The thickness of device layer 1600 is in the range of 2-200 microns and may be formed in one or more growth steps in the epitaxial reactor. Device layer 1600 may be doped n-type or p-type. In the example embodiment, device layer 1600 comprises single crystal silicon that is relaxed and strain free with a thickness of 20 micrometers and is doped n-type. The growth of device layer 1600 overlying second layer 1500 also grows into the recessed regions as shown in FIG. 15 of second layer 1500 corresponding to recessed regions 1400 of FIG. 14. The device layer 1600 filling the recessed regions in layer 1500 as shown in FIG. 15 form stops 1620 that are separated from the surface of semiconductor substrate 1200 by a predetermined distance corresponding to thickness of second layer 1500. Stops 1620 formed in device layer 1600 are also single crystal in structure. The growth of device layer 1600 overlying second layer 1500 results in surface roughness 1610 on the surface of device layer 1600. In an example embodiment, surface roughness 1610 may be in the range of 100 A to 1 micrometer for device layer 1600 comprising single crystal silicon. In FIG. 16, second layer 1500 and first layer 1300 of the second material comprise an intermediate layer 1630 of the second material.

Figure 17:
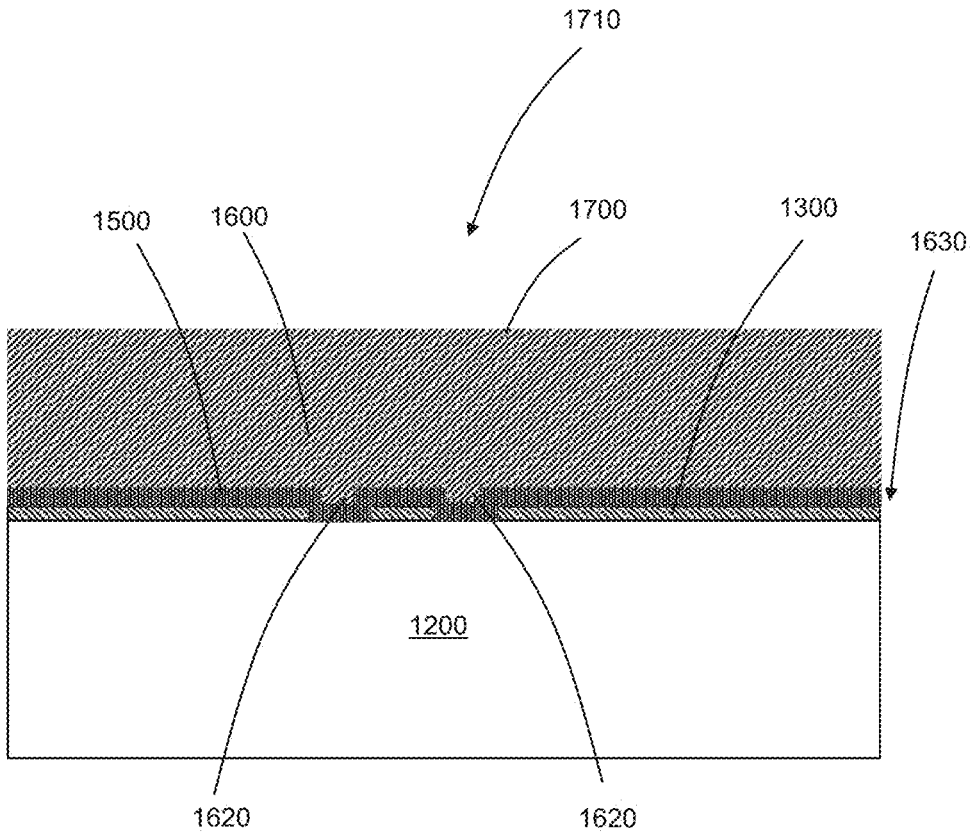
FIG. 17 is an illustration of the device layer of the third material overlying the intermediate layer in accordance with an example embodiment.

FIG. 17 is an illustration of device layer 1600 of a third material overlying intermediate layer 1630 in accordance with an example embodiment. In the example embodiment, intermediate layer 1630 comprises layers 1300 and 1500 of the second material. Surface roughness 1610 of FIG. 16 in device layer 1600 is removed by CMP (Chemical Mechanical Polishing or Planarization) to form planarized surface 1700. The thickness of device layer 1600 removed by CMP to produce planarized surface 1700 is in the range of 100 A to 1 micrometer. Planarized surface 1700 of device layer 1600 enables further process of lithography and etching to form semiconductor devices in subsequent fabrication steps. An engineered substrate 1710 is formed comprising semiconductor substrate 1200, intermediate layer 1630 and device layer 1600 with stops 1620 in accordance with an example embodiment. In the example embodiment, semiconductor substrate of engineered substrate 1710 is a first material comprising single crystal silicon. In the example embodiment with engineered substrate 1710, intermediate layer 1630 comprises a second material of single crystal SiGe that is relaxed and strain free and has a density of dislocations by growing the thickness beyond the critical thickness. In the example embodiment, device layer 1600 comprises a third material of single crystal silicon that is relaxed and strain free and has a density of dislocations by growing the thickness beyond the critical thickness. Device layer 1600 further comprises stops 1620 of single crystal silicon that is relaxed and strain free.

Figure 18:
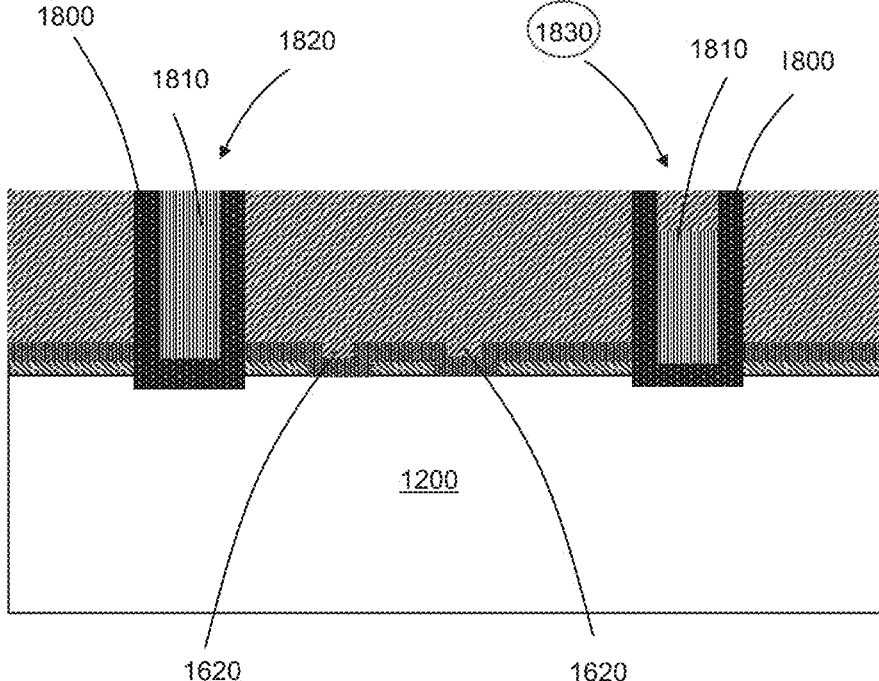
FIG. 18 is an illustration of anchor structures formed in the device layer 1600 and intermediate layer in accordance with an example embodiment.

FIG. 18 is an illustration of anchor structures 1810 and 1820 formed in device layer 1600 and intermediate layer 1630 in accordance with an example embodiment. Anchor structures 1810 and 1820 are formed by etching one or more voids in device layer 1600 and intermediate layer 1630 such that the surface of underlying semiconductor substrate 1200 is exposed. Alternatively, the voids can be extended below a surface of semiconductor substrate 1200. The voids that are formed in device layer 1600 and intermediate layer 1630 are then subsequently refilled by one or more layers that are deposited conformally in the voids. In one embodiment, the voids are refilled with layer 1800 which is a dielectric material and refill layer 1810 which may be dielectric or conducting. Layer 1800 couples with the exposed surface of underlying semiconductor substrate 1200 and refill layer 1810 completely refills the voids. In an example embodiment, layer 1800 comprises a conformal layer of LPCVD silicon nitride and refill layer 1810 comprises a conformal layer of LPCVD LTO (Low Temperature Oxide). Layer 1800 and refill layer 1810 are then removed from surface of device layer 1600 using CMP (chemical-mechanical planarization) to form anchor structures 1810 and 1820.

Figure 19:
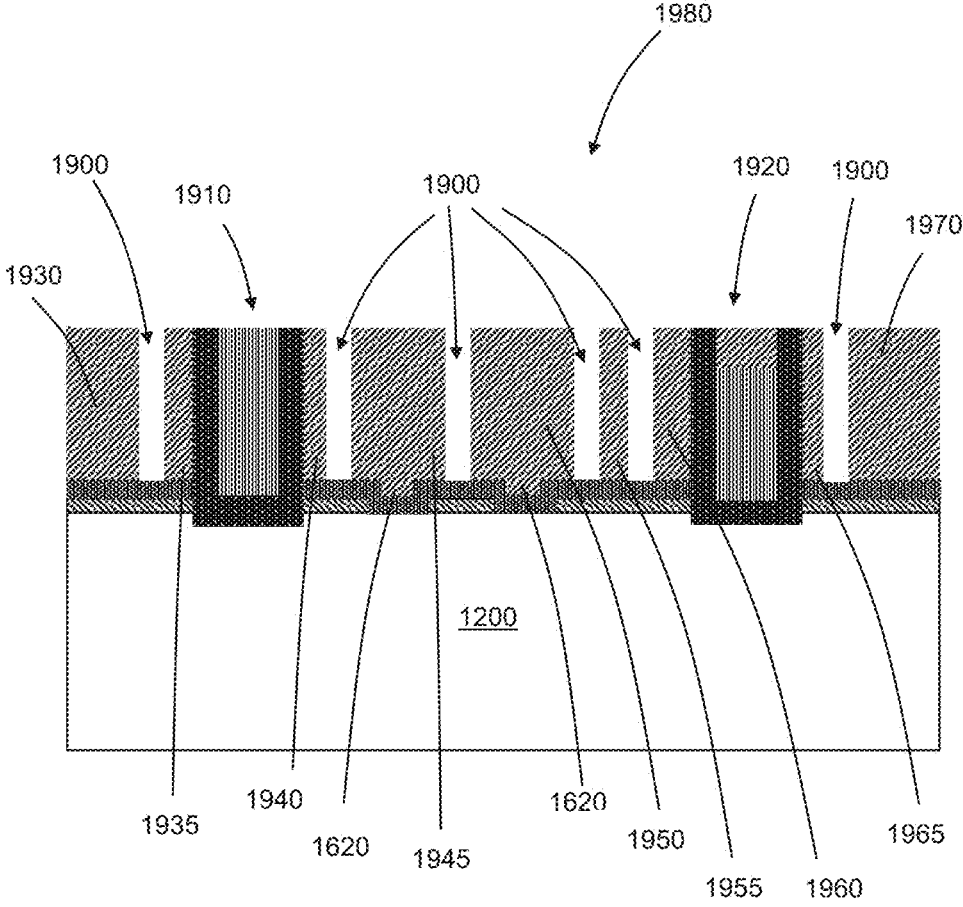
FIG. 19 is an illustration of a semiconductor device formed in accordance with an example embodiment.

FIG. 19 is an illustration of a semiconductor device 1980 formed in accordance with an example embodiment. In an example embodiment, semiconductor device 1980 is a MEMS (micro electro-mechanical system) device. To form the MEMS device, openings 1900 are formed in device layer 1600 to expose portions of underlying intermediate layer 1630. Openings 1900 are formed in device layer 1600 comprising single crystal silicon using DRIE (Deep Reactive Ion Etching) which results in trenches providing access to the underlying portions of intermediate layer 1630 comprising single crystal SiGe. Openings 1900 in device layer 1600 results in patterned device layer 1930, 1935, 1940, 1945, 1950, 1955, 1960, 1965 and 1970. Openings 1900 enable the formation of anchors 1910 and 1920 of semiconductor device 1980 comprising a MEMS device. Anchor 1910 comprises patterned device layer 1935 and 1940 coupled to layer 1800 of FIG. 18 comprising a dielectric material coupled to surface of underlying semiconductor substrate 1200 and refill layer 1810. Anchor 1920 comprise patterned device layer 1960 and 1965 coupled with layer 1800 of FIG. 18 comprising a dielectric material coupled to surface of underlying semiconductor substrate 1200 and refill layer 1810.

Figure 20:
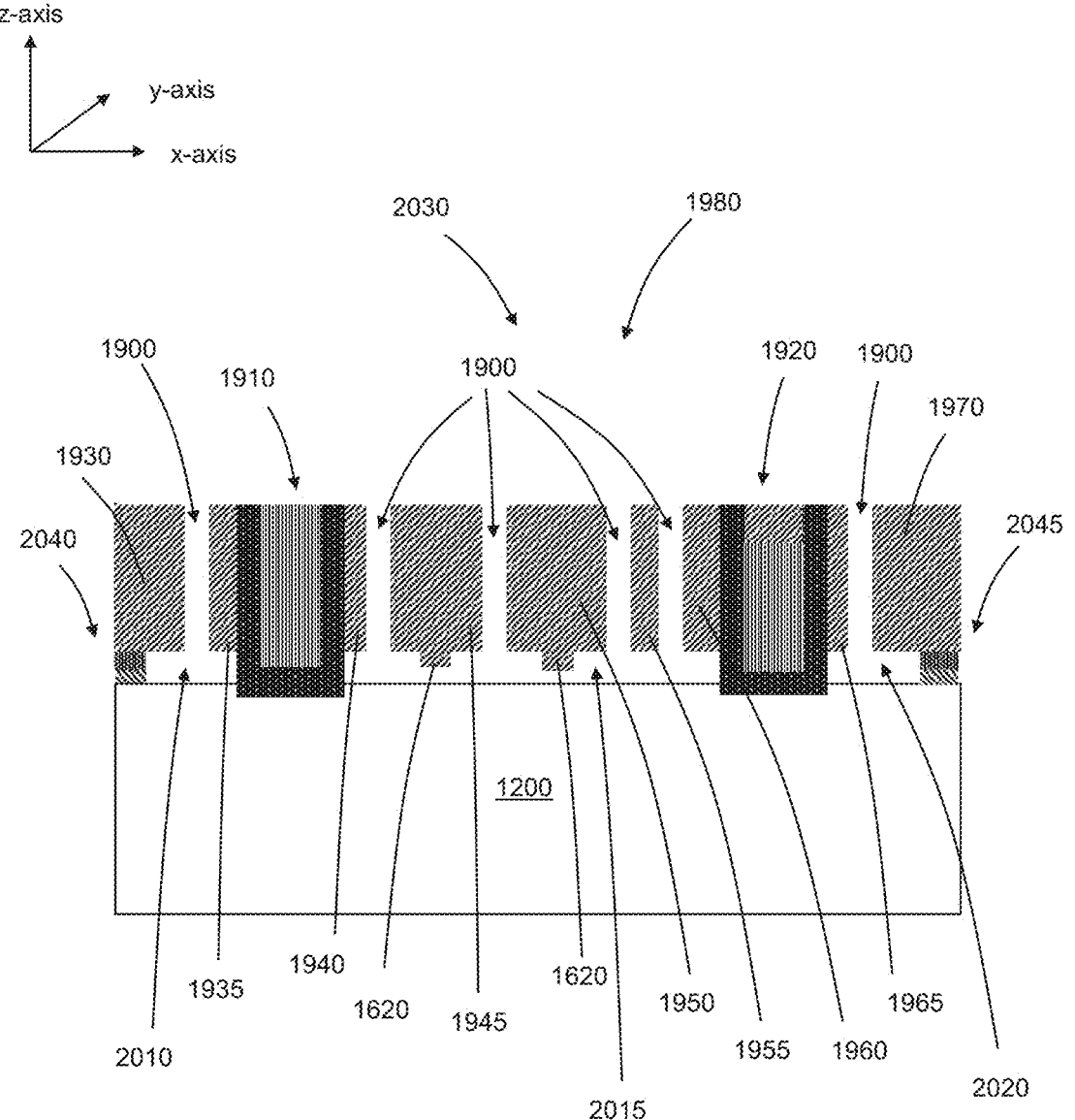
FIG. 20 is an illustration of the MEMS device formed in accordance with an example embodiment.

FIG. 20 is an illustration of the MEMS device in accordance with an example embodiment. In FIG. 20, semiconductor device 1980 is a MEMS (micro electro-mechanical system) device. In an example embodiment, semiconductor device 1980 is a MEMS device that is responsive to inertial forces. In the example embodiment, the MEMS device is an acceleration sensor or accelerometer that responds to acceleration in the z-axis.

In FIG. 20, openings 1900 in device layer 1600 are used to introduce etchants that selectively remove portions of intermediate layer 1630 to form undercut regions 2010, 2015 and 2020. The etchants that are used for the selective removal of portions of intermediate layer 1630 may be liquid, gas or vapor. In the example embodiment, device layer 1600 of FIG. 17 comprises single crystal silicon and intermediate layer 1630 of FIG. 17 comprise single crystal SiGe. In an example embodiment, vapor phase HCl is used to selectively remove portions of intermediate layer 1630 comprising SiGe to form undercut regions 2010, 2015 and 2020. In addition, the formation of undercut regions 2010 and 2020 results in field regions 2040 and 2045. Field region 2040 comprise patterned device layer 1930 and portion of intermediate layer 1630 adjacent to undercut region 2010 and field region 2045 comprise patterned device layer 1970 and portion of intermediate layer 1630 adjacent to undercut region 2020.

In FIG. 20, anchor structure 1920 along with moving mass 2030 comprise the dynamic element of the MEMS device that can respond to an input acceleration. Moving mass 2030 comprises patterned device layer 1955 acting as a spring suspension and patterned device layer 1945 and 1950 acting as a proof mass. Patterned device layer 1945 and 1950 have stops 1620 which reduces the spacing or gap of the proof mass of moving mass 2030 to the underlying semiconductor substrate 1200. Thus, the movement of the proof mass is limited to the gap between stops 1620 and the surface of semiconductor substrate 1200.

Anchor structure 1910 acts as the static element of the MEMS device. The relative movement of the dynamic element of the accelerometer comprising moving mass 2030 with respect to the static element of the accelerometer comprising anchor 1910 is used to detect the input vertical acceleration using different transduction principles. In the example embodiment, the relative movement of the dynamic element of the accelerometer comprising moving mass 2030 with respect to the static element of the accelerometer comprising anchor 1910 is detected by using capacitive transduction.

When an input acceleration acts on the moving mass, the proof mass moves down in the −z direction due to the flexibility of spring suspension comprising patterned device layer 1955 attached to anchor 1920. Since stops 1620 are at a smaller distance to the surface of underlying semiconductor substrate, they act as a motion limiting stop for moving mass 2030 due to an input vertical acceleration. Since the area of stops 1620 that come into contact with the surface of underlying semiconductor substrate 1200, the restoring force of the spring suspension is higher than the attractive force of surface contact preventing catastrophic failure of the MEMS device due to shock or other operational conditions. Since stops 1620 are comprised of device layer 1600 comprising silicon crystal material, they are strong and robust to withstand shock, vibration, acceleration and other inertial forces. Although the formation of stops 1620 differs from stops 410 of FIG. 10, operation of the MEMS device of FIG. 11 would be identical if stops 410 and stops 1620 have identical spacings respectively to semiconductor substrates 100 and 1200.

The descriptions disclosed herein below will call out components, materials, inputs, or outputs from FIGS. 1-20.

In one embodiment, a method of forming one or more stops 410 for a moving mass 1040 of a microelectromechanical system (MEMS) device 1100 comprises providing a semiconductor substrate 100 of a first material, etching an intermediate layer 200 of a second material overlying semiconductor substrate 100 to form one or more recessed regions 300, forming a device layer 400 of the third material overlying intermediate layer 200 wherein semiconductor substrate 100, intermediate layer 200, and device layer 400 are single crystal, wherein device layer 400 is configured to fill the one or more recessed regions 300 in intermediate layer 200 that form the one or more stops 410, and wherein intermediate layer 200 and device layer 400 are configured to have dislocations to remove strain, etching device layer 400 to isolate moving mass 1040 having the one or more stops 410 from non-moving areas of MEMS device 1100, and releasing moving mass 1040 by etching intermediate layer 200 underlying moving mass 1040 wherein moving mass 1040 has a predetermined distance 430 between surfaces of the one or more stops 410 and semiconductor substrate 100 and is configured to limit movement of moving mass 1040 to predetermined distance 430.

In one embodiment, the method further includes forming at least one anchor 820 comprising one or more dielectric materials coupled to semiconductor substrate 100 and forming at least one spring coupled between anchor structure 820 to moving mass 1040.

In one embodiment, the method further includes etching device layer 400 and intermediate layer 200 to form one or more voids 600 wherein the one are more voids 600 are etched subsequent to forming the one or more recessed regions 300, forming a first layer 700 of a dielectric material overlying the one or more voids 600 wherein the first dielectric material is a conformal material and wherein the first dielectric material couples to semiconductor substrate 100 on a surface or below a surface 610 of semiconductor substrate 100, forming a second layer 710 of a fourth material to fill the one or more voids 600, and planarizing a surface of device layer 400 thereby removing the dielectric material and the fourth material overlying the surface of device layer 400.

In one embodiment, the method wherein the at least one anchor 820 is electrically isolated from the substrate.

In one embodiment, the method further includes forming the at least one spring having a spring force greater than a stiction force of the one or more stops 410 to semiconductor substrate 100.

In one embodiment, the method wherein semiconductor substrate 100 and device layer 400 comprises silicon and wherein intermediate layer 200 comprises Silicon Germanium (SiGe).

In one embodiment, the method further includes forming intermediate layer 200 and device layer 400 in an epitaxial reactor, growing intermediate layer 200 beyond a critical thickness whereby dislocations occur in intermediate layer 200 to make intermediate layer 200 strain free and growing device layer 400 beyond a critical thickness whereby dislocations occur in device layer 400 to make device layer 400 strain free.

In one embodiment, the method further includes etching the one or more recessed regions 300 in intermediate layer 200 of the second material as a timed etch such that the underlying semiconductor substrate 100 is not exposed.

In one embodiment, the method further includes etching the one or more recessed regions 1400 in intermediate layer 1300 of the second material to expose the surface of the semiconductor substrate 1200, forming a second layer 1500 of the second material overlying intermediate layer 1300 of a predetermined thickness wherein the second layer 1500 is conformal and fills the one or more recessed regions 1400 to the predetermined thickness and releasing the moving mass by etching intermediate layer 1300 and second layer 1500 underlying the moving mass wherein the predetermined thickness of second layer 1500 corresponds to the predetermined distance of the moving mass between surfaces of the one or more stops 1620 and semiconductor substrate 1200.

In one embodiment, the method wherein the one or more stops 1620 of the MEMS device is a vertical stop and wherein the one or more stops 1620 is single crystal.

In one embodiment, a method of forming one or more stops 410 for a moving mass 1040 of a microelectromechanical sensor (MEMS) comprises providing a semiconductor substrate 100 of a first material, etching an intermediate layer 200 of a second material overlying semiconductor substrate 100 to form one or more recessed regions 300, forming a device layer 400 of the third material overlying intermediate layer 200 wherein semiconductor substrate 100, intermediate layer 200, and device layer 400 are single crystal and wherein device layer 400 is configured to fill the one or more recessed regions 300 in intermediate layer 200 that form the one or more stops 410 of moving mass 1040, etching device layer 400, intermediate layer 200, and semiconductor substrate 100 wherein etched regions corresponds to at least one anchor 820, forming a first layer of a dielectric material wherein the first dielectric material is a conformal material, wherein the dielectric material couples to semiconductor substrate 100 at or below a surface 610 of semiconductor substrate 100, and wherein the at least one anchor 820 is electrically isolated from semiconductor substrate 100, forming a second layer of a fourth material, planarizing a surface of device layer 400 thereby removing first dielectric material and the fourth material overlying the surface of device layer 400, etching device layer 400 to define moving mass 1040 wherein a surface of intermediate layer 200 is exposed and releasing moving mass 1040 wherein moving mass 1040 has a predetermined distance 430 between surfaces of the one or more stops 410 and semiconductor substrate 100 and is configured to limit movement of moving mass 1040 to predetermined distance 430.

In one embodiment, the method further includes forming at least one spring coupled between at least one anchor 820 and moving mass 1040 having a spring force greater than a stiction force of one or more stops 410 to semiconductor substrate 100.

In one embodiment, the method further includes growing intermediate layer 200 and device layer 400 in an epitaxial reactor, growing intermediate layer 200 beyond the critical thickness and growing device layer 400 beyond the critical thickness wherein semiconductor substrate 100 and device layer 400 comprises silicon, wherein intermediate layer 200 comprises Silicon Germanium (SiGe) and wherein intermediate layer 200 and device layer 400 are strain free due to dislocations.

In one embodiment, the method further includes etching the one or more recessed regions 300 in intermediate layer 200 of the second material as a timed etch such that underlying semiconductor substrate 100 is not exposed and releasing moving mass 1040 by etching intermediate layer 200 underlying moving mass 1040.

In one embodiment, the method further includes etching the one or more recessed regions 1400 in intermediate layer 1300 of the second material to expose the surface of semiconductor substrate 1200, forming a second layer 1500 of the second material of a predetermined thickness overlying intermediate layer 1300 wherein second layer 1500 is conformal and fills the one or more recessed regions 1400 to the predetermined thickness and releasing the moving mass by etching the intermediate layer 1300 and second layer 1500 underlying the moving mass wherein the predetermined distance corresponds to the predetermined thickness of second layer 1500.

In one embodiment, a microelectromechanical sensor (MEMS) having at least one stop 410 for a moving mass 1040 comprises a semiconductor substrate 100 comprising silicon, an intermediate layer 200 overlying semiconductor substrate 100 comprising silicon germanium (SiGe), such that moving mass 1040 is configured to be formed in a device layer 400 comprising silicon overlying the SiGe layer wherein semiconductor substrate 100, intermediate layer 200, and device layer 400 are single crystal, wherein intermediate layer 200 and device layer 400 are configured to be grown beyond a critical thickness, wherein the at least one stop 410 extends from a bottom surface of moving mass 1040 of a predetermined depth and has a predetermined area, and wherein intermediate layer 200 is configured to be removed underlying moving mass 1040, at least one anchor 820 coupled to semiconductor substrate 100 wherein the at least one anchor 820 is electrically isolated from semiconductor substrate 100 and a spring coupled between the at least one anchor 820 and moving mass 1040 wherein the spring is configured having a spring force greater than a stiction force of the at least one stop 410 to semiconductor substrate 100 to support release of moving mass 1040 when the at least one stop 410 couples to semiconductor substrate 100.

In one embodiment, the microelectromechanical sensor (MEMS) wherein intermediate layer 200 and device layer 400 are grown in an epitaxial reactor, wherein intermediate layer 200 and device layer 400 are stress free due to dislocations, wherein at least one recessed region 300 is etched in intermediate layer 200 underlying moving mass 1040, wherein the at least one recessed region 300 corresponds to the at least one stop 410, and wherein device layer 400 is configured to fill the at least one recessed region 300.

In one embodiment, the microelectromechanical sensor (MEMS) wherein recessed region 300 is configured to be formed by a timed etch.

In one embodiment, the microelectromechanical sensor (MEMS) wherein at least one recessed region 1400 is configured to be etched to expose a surface of semiconductor substrate 1200, wherein a second layer 1500 of a predetermined thickness is configured to be formed overlying the intermediate layer, wherein device layer 1600 is configured to fill the at least one recessed region 1400, and wherein the intermediate layer and the second layer 1500 are configured to be removed underlying the moving mass.

In one embodiment, the microelectromechanical sensor (MEMS) wherein the at least one anchor 1920 comprises an etched region that couples through device layer 1600, intermediate layer 1630, and is at or below a surface of semiconductor substrate 1200, wherein a layer of silicon nitride is configured to be formed overlying the etched region, wherein a layer of polycrystalline silicon is configured to be formed overlying the silicon nitride layer, and wherein a surface of device layer 1600 is configured to be exposed by polishing to form the at least one anchor 1920.

What is claimed is:

1. A method of forming one or more stops for a moving mass of a microelectromechanical system (MEMS) device, the method comprising:
   providing a semiconductor substrate of a first material;
   etching an intermediate layer of a second material overlying the semiconductor substrate to form one or more recessed regions;
   forming a device layer of a third material overlying the intermediate layer,
      wherein the semiconductor substrate, the intermediate layer, and the device layer are single crystal layers,
      wherein the device layer is configured to fill the one or more recessed regions in the intermediate layer that form the one or more stops, and
      wherein the intermediate layer and the device layer are configured to have dislocations to remove strain;
   etching the device layer to isolate the moving mass having the one or more stops from non-moving areas of the MEMS device; and
   releasing the moving mass by etching the intermediate layer underlying the moving mass
      wherein a predetermined distance is formed between surfaces of the one or more stops and the substrate and an extent of movement of the moving mass is limited to the predetermined distance.

2. The method of claim 1, wherein the semiconductor substrate and the device layer comprise Silicon and wherein the intermediate layer comprises Silicon Germanium (SiGe).

3. The method of claim 1, comprising:
   forming the intermediate layer and the device layer in an epitaxial reactor;
   growing the intermediate layer beyond a critical thickness whereby the dislocations occur in the intermediate layer to make the intermediate layer strain free; and
   growing the device layer beyond a critical thickness whereby the dislocations occur in the device layer to make the device layer strain free.

4. The method of claim 1, further including etching the one or more recessed regions in the intermediate layer of the second material using a timed etch such that the semiconductor substrate is not exposed.

5. The method of claim 1, further including:

etching the one or more recessed regions in the intermediate layer of the second material to expose a surface of the semiconductor substrate;

forming an auxiliary intermediate layer of the second material of a predetermined thickness overlying the intermediate layer, wherein the auxiliary intermediate layer is conformal and fills the one or more recessed regions to the predetermined thickness; and releasing the moving mass by etching the intermediate layer and the auxiliary intermediate layer underlying the moving mass, wherein the predetermined thickness of the auxiliary intermediate layer corresponds to the predetermined distance between surfaces of the one or more stops and the substrate to which the extent of movement of the moving mass is limited.

6. The method of claim 1, wherein the one or more stops is a vertical stop and wherein the one or more stops comprise single crystal semiconductor material.

7. The method of claim 1, further including:

forming at least one anchor comprising one or more dielectric materials and coupled to the substrate; and forming at least one spring coupled to the at least one anchor and to the moving mass.

8. The method of claim 7, wherein the at least one anchor is electrically isolated from the substrate.

9. The method of claim 7, further including:

subsequently to forming the one or more recessed regions, etching the device layer and the intermediate layer to form one or more voids;

forming a first layer of a first dielectric material overlying the one or more voids, wherein the first dielectric material is a conformal material and wherein the first dielectric material couples to the substrate on a surface of the substrate or below the surface of the substrate;

forming a second layer of a fourth material to fill the one or more voids; and planarizing a surface of the device layer thereby removing the first layer of the dielectric material and the fourth material overlying the surface of the device layer.

10. The method of claim 9, further including forming the at least one spring having a spring force greater than a stiction force of the one or more stops to the substrate.

11. A method of forming one or more stops for a moving mass of a microelectromechanical sensor (MEMS), the method comprising:

providing a semiconductor substrate of a first material;

etching a first intermediate layer of a second material overlying the semiconductor substrate to form one or more recessed regions;

forming a device layer of a third material overlying the intermediate layer, wherein the semiconductor substrate, the first intermediate layer, and the device layer are single crystal layers and wherein the device layer is configured to fill the one or more recessed regions in the first intermediate layer that form the one or more stops of the moving mass;

etching the device layer, the first intermediate layer, and the semiconductor substrate to form etched regions corresponding to at least one anchor;

forming a first layer of a first dielectric material, wherein the first dielectric material is a conformal material, wherein the first dielectric material couples to the semiconductor substrate at or below a surface thereof, and wherein the at least one anchor is electrically isolated from the semiconductor substrate;

forming a second layer of a fourth material;

planarizing a surface of the device layer thereby removing the first dielectric material and the fourth material overlying a surface of the device layer;

etching the device layer to define the moving mass to expose wherein a surface of the intermediate layer; and releasing the moving mass to define a predetermined distance between surfaces of the one or more stops and the substrate and to limit an extent of movement of the moving mass to the predetermined distance.

12. The method of claim 11, further including forming at least one spring coupled between the at least one anchor and the moving mass, the spring having a spring force greater than a stiction force of the one or more stops to the substrate.

13. The method of claim 11, further including:

growing the intermediate layer and the device layer in an epitaxial reactor;

growing the first intermediate layer beyond a critical thickness of the first intermediate layer; and growing the device layer beyond a critical thickness of the device layer, wherein the semiconductor substrate and the device layer comprise Silicon, wherein the intermediate layer comprises Silicon Germanium (SiGe), and wherein the first intermediate layer and the device layer are strain free due to dislocations.

14. The method of claim 11, further including:

etching the one or more recessed regions in the first intermediate layer of the second material using a timed etch such as to not expose the semiconductor substrate;

releasing the moving mass by etching the first intermediate layer underlying the moving mass.

15. The method of claim 11, further including:

etching the one or more recessed regions in the intermediate layer of the second material to expose a surface of the semiconductor substrate;

forming a second intermediate layer of the second material that has a predetermined thickness of the second intermediate layer, the second intermediate layer overlying the first intermediate layer, wherein the second intermediate layer is conformal and fills the one or more recessed regions to the predetermined thickness of the second intermediate layer; and releasing the moving mass by etching the first intermediate layer and the second intermediate layer underlying the moving mass, wherein the predetermined distance corresponds to the predetermined thickness of the second intermediate layer.

16. A microelectromechanical sensor (MEMS) having at least one stop for a moving mass, the sensor comprising:

a substrate comprising silicon;

a first intermediate layer overlying the substrate, the first intermediate layer comprising silicon germanium (SiGe);

wherein the moving mass is formed in a device layer of the sensor, the device layer comprising silicon overlying the intermediate layer comprising SiGe, wherein the substrate, the first intermediate layer, and the device layer are single crystal layers, wherein the first intermediate layer and the device layer have thicknesses beyond a critical thickness, wherein the at least one stop extends from a bottom surface of the moving mass to a predetermined depth and has a predetermined area, and wherein the first intermediate layer is configured to be removable under the moving mass;

at least one anchor coupled to the substrate and electrically isolated from the substrate; and

a spring coupled between the at least one anchor and the moving mass and having a spring force greater than a stiction force of the at least one stop to the substrate to support release of the moving mass when the at least one stop couples to the substrate.

17. The microelectromechanical sensor (MEMS) of claim 16, wherein at least one recessed region is configured to expose a surface of the substrate, wherein a second intermediate layer of a predetermined thickness is overlying the first intermediate layer, wherein the device layer fills at least one recessed region present in the first intermediate layer underlying the moving mass, and wherein the first intermediate layer and the second intermediate layer are removed under the moving mass.

18. The microelectromechanical sensor (MEMS) of claim 16, wherein the at least one anchor comprises an etched region that couples through the device layer, the intermediate layer, and is at or below a surface of the substrate, wherein a layer of silicon nitride is formed overlying the etched region, wherein a layer of polycrystalline silicon is formed overlying the silicon nitride layer, and wherein a surface of the device layer supports the at least one anchor.

* * * * *